(12) United States Patent
Wan

(10) Patent No.: US 7,859,246 B2
(45) Date of Patent: Dec. 28, 2010

(54) MODULAR ENERGY METER

(75) Inventor: Jiasheng Wan, Wuhan (CN)

(73) Assignee: Hubei Shengjia Electric Apparatus Co., Ltd., Hubei (CH)

( * ) Notice: Subject to any disclaimer, the term of this patent is extended or adjusted under 35 U.S.C. 154(b) by 0 days.

(21) Appl. No.: 12/762,541

(22) Filed: Apr. 19, 2010

(65) Prior Publication Data

US 2010/0201348 A1   Aug. 12, 2010

Related U.S. Application Data

(63) Continuation of application No. PCT/CN2008/001751, filed on Oct. 17, 2008.

(30) Foreign Application Priority Data

Oct. 17, 2007  (CN) .......................... 2007 1 0053579
Nov. 13, 2007  (CN) .......................... 2007 1 0169674

(51) Int. Cl.
    *G01R 11/32* (2006.01)
(52) U.S. Cl. .................................................. 324/142
(58) Field of Classification Search ................. 324/142, 324/141, 110, 127, 156, 107, 103 R; 361/641, 361/657, 659, 664, 666, 668, 669, 671, 672; 702/60, 61, 62, 64, 65
    See application file for complete search history.

(56) References Cited

U.S. PATENT DOCUMENTS

| | | | | |
|---|---|---|---|---|
| 5,933,004 | A | * | 8/1999 | Jackson et al. .............. 324/142 |
| 6,892,144 | B2 | * | 5/2005 | Slater et al. ................... 702/61 |

\* cited by examiner

*Primary Examiner*—Minh N Tang
*Assistant Examiner*—Trung Q Nguyen
(74) *Attorney, Agent, or Firm*—Matthias Scholl P.C.; Matthias Scholl

(57) ABSTRACT

A modular energy meter, containing at least a power line access module, the power line access module containing at least a phase line access portion having an input end and an output end, and a zero line access portion having an input end and an output end, and at least one modular energy metering device each having a phase line input end, a zero line input end, and a phase line output end. The input end of the phase line access portion is connected to a phase line of a power line. The input end of the zero line access portion is connected to a zero line of the power line. The modular energy metering device operates to measure energy values output from a phase line output end and a zero line output end of the power line. The output end of the phase line access portion is connected to the phase line input end of the modular energy metering device. The phase line output end of the modular energy metering device is connected to a phase line output line. The output end of the zero line access portion is connected to a zero line output line. The number of the zero line output lines and the phase line output lines corresponds to that of the modular energy metering devices.

18 Claims, 29 Drawing Sheets

MODULAR ENERGY METER

CROSS-REFERENCE TO RELATED APPLICATIONS

This application is a continuation of International Patent Application No. PCT/CN2008/001751 with an international filing date of Oct. 17, 2008, designating the United States, now pending, and further claims priority benefits to Chinese Patent Application No. 200710053579.8 filed Oct. 17, 2007, and to Chinese Patent Application No. 200710169674.4 filed Nov. 13, 2007. The contents of all of the aforementioned applications, including any intervening amendments thereto, are incorporated herein by reference.

BACKGROUND OF THE INVENTION

1. Field of the Invention

The invention relates to an electric measuring device, and more particularly to a modular energy meter.

2. Description of the Related Art

Nowadays energy meters are widely used in industries as main electric measuring devices. However, there are several problems with the conventional energy meter: firstly, since energy meters from different producers have different standards, a power sector has to add some auxiliary equipments whereby enabling them to work altogether, which increases size of the energy meters and production cost; secondly, once requirements and standards for managing electricity application are changed, the power sector has to spend a lot of money on updating and replacing existing energy meters, which greatly increases cost; thirdly, during application of the energy meters, arrangement of wires needs high labor cost, installation thereof is very difficult, and power consumption thereof is very high; if one or some of the energy meters fail or need to be replaced, the total energy meters have to be discarded, which causes unnecessary overlapping investment of the energy meters and increases cost for users and the power sector.

SUMMARY OF THE INVENTION

In view of the above-described problem, it is one objective of the invention to provide a modular energy meter capable of addressing the above-mentioned problems.

To achieve the above objectives, in accordance with one embodiment of the invention, provided is a modular energy meter, comprising a power line access module, comprising a phase line access portion having an input end and an output end, and a zero line access portion having an input end and an output end, and at least one modular energy metering device each having a phase line input end, a zero line input end, and a phase line output end. The input end of the phase line access portion is connected to a phase line of a power line, the input end of the zero line access portion is connected to a zero line of the power line, the modular energy metering device operates to measure energy values output from a phase line output end and a zero line output end of the power line, the output end of the phase line access portion is connected to the phase line input end of the modular energy metering device, the phase line output end of the modular energy metering device is connected to a phase line output line, the output end of the zero line access portion is connected to a zero line input line, and the number of the zero line output lines and the phase line output lines corresponds to that of the modular energy metering devices.

In a class of this embodiment, the power line access module and the modular energy metering device are modularly disposed in a case, and the case comprises a power line input interface, a zero line output interface, a phase line output interface, and a cover.

In a class of this embodiment, the modular energy metering device further comprises a power supply unit, an energy metering unit, and a pulse signal output unit, the power supply unit operates to provides operating power, the energy metering unit operates to measure energy from the phase line input end and the zero line input end, and consumed by users, and the pulse signal output unit operates to transform energy measured by the energy metering unit into a pulse signal and to output the pulse signal.

In a class of this embodiment, the power supply unit, the energy metering unit, and the pulse signal output unit are disposed in a box and enclosed by a cover of the box, and the phase line input end and the phase line output end are disposed on both ends of the box.

In a class of this embodiment, the energy metering unit comprises a current signal collecting circuit, a voltage signal collecting circuit, and an operational and processing circuit, the current signal collecting circuit operates to collect a current signal on the power line in real time, the voltage signal collecting circuit operates to collect a voltage signal on the power line in real time, and the operational and processing circuit operates to multiply the current signal by the voltage signal whereby obtaining an instant power, and further an energy value within a given time interval by an integrator In a class of this embodiment, the pulse signal output unit is a voltage/frequency conversion and frequency-division circuit In a class of this embodiment, an output end of the pulse signal output unit and the zero line input end are integrated on a parallel port.

In a class of this embodiment, the phase line access portion comprises at least a phase line access sub-portion, the phase line access sub-portion is made of conductive materials, and comprises an input end and at least a phase line output end, the input end of the phase line access sub-portion is connected to the phase line of the power line, and the phase line output end of the phase line access sub-portion is connected to the phase line input end of the modular energy metering device.

In a class of this embodiment, it further comprises an upper shield and a lower shield made of insulation materials and heat-insulating materials, and operating to cover exposed parts of the phase line access sub-portion.

In accordance with another embodiment of the invention, provided is a modular energy meter, comprising a power line access module, comprising a phase line access portion having an input end and an output end, and a zero line access portion having an input end and an output end, and at least one modular energy metering device each having a phase line input end, a zero line input end, a phase line output end, and a zero line output end, wherein the input end of the phase line access portion is connected to a phase line of a power line, the input end of the zero line access portion is connected to a zero line of the power line, the modular energy metering device operates to measure energy output from a phase line output end and a zero line output end of the power line, the output end of the phase line access portion is connected to the phase line input end of the modular energy metering device, the phase line output end of the modular energy metering device is connected to a phase line output line, the output end of the zero line access portion is connected to a zero line input line, and the zero line output end of the modular energy metering device is connected to a zero line output line.

In a class of this embodiment, the power line access module and the modular energy metering device are modularly disposed in a case, and the case comprises a power line input interface, a zero line output interface, a phase line output interface, and a cover.

In a class of this embodiment, the modular energy metering device further comprises a power supply unit, an energy metering unit, and a pulse signal output unit, the power supply unit operates to provides operating power, the energy metering unit operates to measure energy from the phase line input end and the zero line input end, and consumed by users, and the pulse signal output unit operates to transform energy measured by the energy metering unit into a pulse signal and to output the pulse signal.

In a class of this embodiment, the power supply unit, the energy metering unit, and the pulse signal output unit are disposed in a box and enclosed by a cover of the box, and the phase line input end and the phase line output end are disposed on both ends of the box.

In a class of this embodiment, the energy metering unit comprises a current signal collecting circuit, a voltage signal collecting circuit, and an operational and processing circuit, the current signal collecting circuit operates to collect a current signal on the power line in real time, the voltage signal collecting circuit operates to collect a voltage signal on the power line in real time, and the operational and processing circuit operates to multiply the current signal by the voltage signal whereby obtaining an instant power, and further an energy value within a given time interval by an integrator.

In a class of this embodiment, the pulse signal output unit is a voltage/frequency conversion and frequency-division circuit.

In a class of this embodiment, an output end of the pulse signal output unit and the zero line input end are integrated on a parallel port.

In a class of this embodiment, the phase line access portion comprises at least a phase line access sub-portion, the phase line access sub-portion is made of conductive materials, and comprises an input end and at least a phase line output end, the input end of the phase line access sub-portion is connected to the phase line of the power line, and the phase line output end of the phase line access sub-portion is connected to the phase line input end of the modular energy metering device.

In a class of this embodiment, it further comprises an upper shield and a lower shield made of insulation materials and heat-insulating materials, and operating to cover exposed parts of the phase line access sub-portion.

Advantages of the Invention Comprise:

1. the modular energy meter of the invention integrates various functions required by the power sector, and features small size;

2. customized production of the modular energy meter can be facilitated by relevant production sectors according to different requirements of the power sector, and thus mass production is high efficient, and production cost is reduced;

3. the modular energy meter reduces investment cost and installation time, makes it possible to facilitate accurate management of electricity application, and decreases power consumption; and 4. once one or some of the modules fail during operation of the modular energy meter, only the failed modules need to be replaced, and thus overlapping investment is avoided, and cost of users and the power sector is reduced.

DETAILED DESCRIPTION OF THE EMBODIMENTS

Detailed description will be given below in conjunction with accompanying drawings.

Figure 1A:
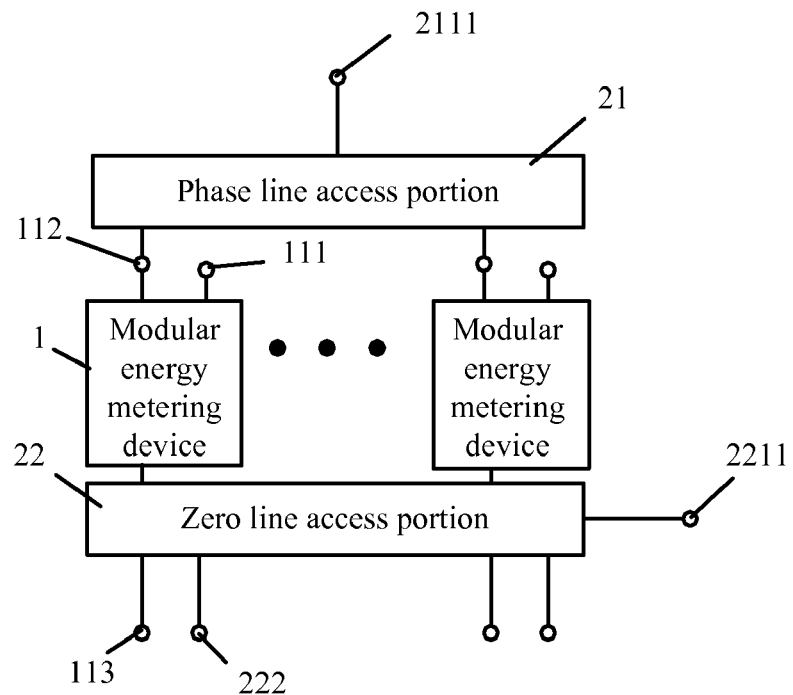
FIG. 1A is a block diagram of a modular energy meter of an exemplary embodiment of the invention.

As shown in FIG. 1A, a modular energy meter of a first embodiment of the invention comprises a power line access module 2, and at least one modular energy metering device 1.

The power line access module 2 comprises a phase line access portion 21 having an input end and an output end, and a zero line access portion 22 having an input end and an output end.

The modular energy metering device 1 has a phase line input end 112, a zero line input end 111, and a phase line output end 113.

The input end 2111 of the phase line access portion 21 is connected to a phase line of a power line, and the input end 2211 of the zero line access portion 22 is connected to a zero line of the power line.

The modular energy metering device 1 operates to measure energy values output from a phase line output end and a zero line output end of the power line. It should be noted that as only one modular energy metering device 1 is used, the modular energy meter is a single-user meter.

The output end of the phase line access portion 21 is connected to the phase line input end 112 of the modular energy metering device, the phase line output end 113 of the modular energy metering device is connected to a phase line output line, the output end 222 of the zero line access portion 22 is connected to a zero line output line, and the number of the zero line output lines and the phase line output lines corresponds to that of the modular energy metering devices 1.

The power line access module 2 and the modular energy metering device 1 are modularly disposed in a case 3, or integrally disposed on a PCB board. However, it should be noted that the invention is not limited to this.

Figure 1B:
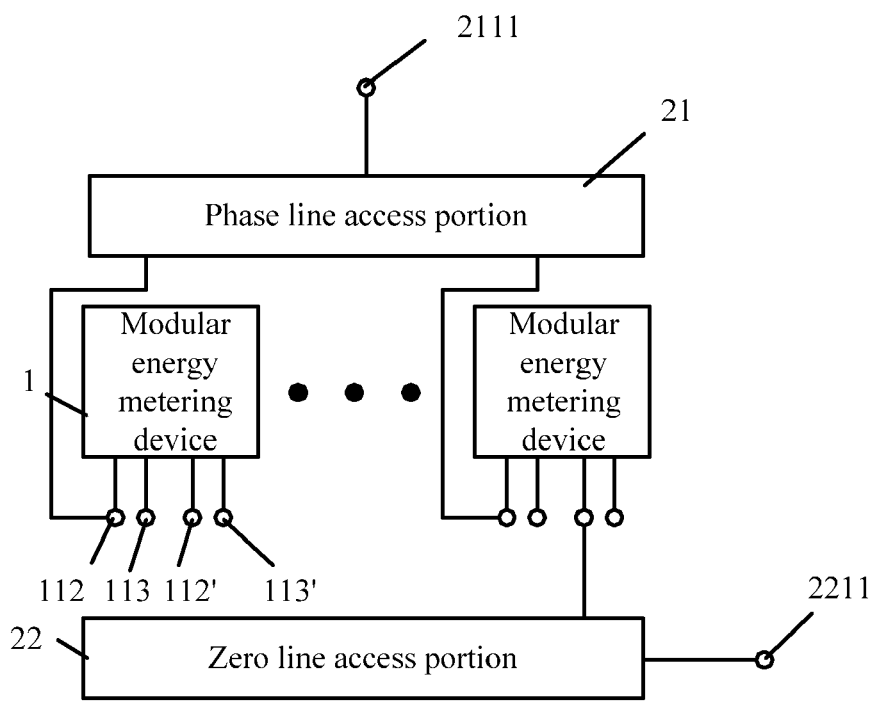
FIG. 1B is a block diagram of a modular energy meter of another exemplary embodiment of the invention.

As shown in FIG. 1B, a modular energy meter of a second embodiment of the invention is illustrated. The modular energy meter of the second embodiment of the invention is almost the same as that of the first embodiment, except that the modular energy metering device 1 has a phase line input end 112, a zero line input end 112', a phase line output end 113, and a zero line output end 113', which are disposed on the same side of the modular energy metering device 1, and operates to measure energy output from a phase line output end and a zero line output end of the power line.

Figure 2A:
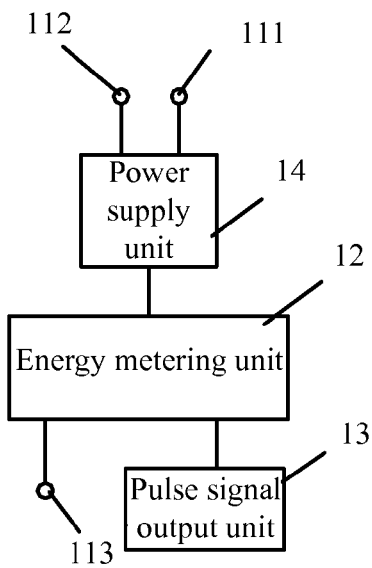
FIG. 2A is a block diagram of a modular energy metering device of an exemplary embodiment of the invention.

As shown in FIG. 2A, a modular energy metering device 1 of an embodiment of the invention comprises a power line I/O unit, a power supply unit 14, an energy metering unit 12, and a pulse signal output unit 13.

The power line I/O unit comprises a phase line input end 112, a zero line input end 111, and a phase line output end 113. The phase line input end 112 is connected to a phase line in a power line, and the phase line output end 113 is connected to an electric device in the next stage.

The power supply unit 14 operates to obtain voltage on the phase line input end 112 and the zero line input end 111, and to transform the voltage whereby providing operating power to components of the modular energy metering device 1.

The energy metering unit 12 is connected to the power supply unit 14, and operates to measure energy from the phase line input end 112 and the zero line input end 111.

The pulse signal output unit 13 is connected to the energy metering unit 12, and operates to transform energy measured by the energy metering unit 12 into a pulse signal, to output the pulse signal as a data input signal of other function extension units.

Figure 2B:
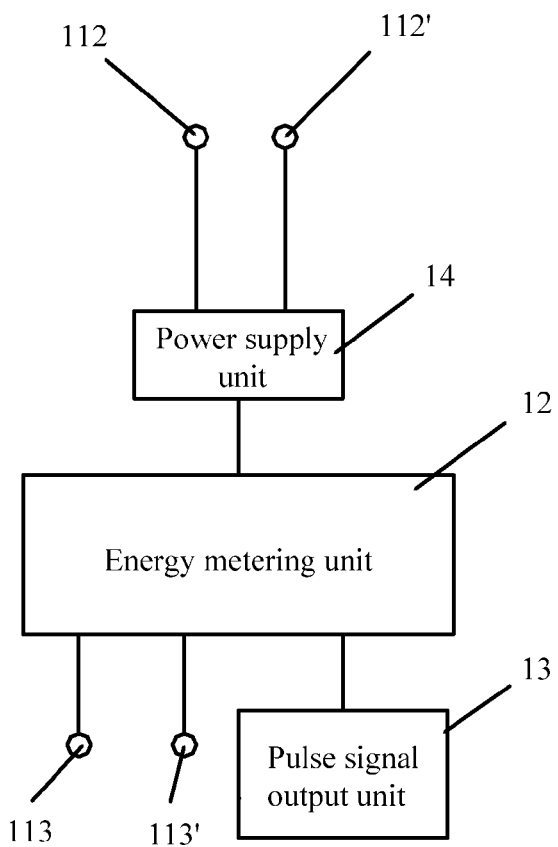
FIG. 2B is a block diagram of a modular energy metering device of another exemplary embodiment of the invention.

As shown in FIG. 2B, a modular energy metering device 1 of another embodiment of the invention is illustrated. The difference between the modular energy metering device of this embodiment and that in FIG. 1B is that, the phase line input end 112 and the zero line input end 111 are disposed at the top of the modular energy metering device 1, and the phase line output end 113 and the zero line output end are disposed at the bottom thereof (namely input ends and output ends are disposed on different sides), the phase line input end 112 is connected to a phase line in a power line, and the phase line output end 113 and the zero line output end are connected to an electric device in the next stage.

The power supply unit 14 operates to obtain voltage on the phase line input end 112 and the zero line input end 111, and to transform the voltage whereby providing operating power to components of the modular energy metering device 1.

The energy metering unit 12 is connected to the power supply unit 14, and operates to measure energy from the phase line input end 112 and the zero line input end 111.

Figure 3:
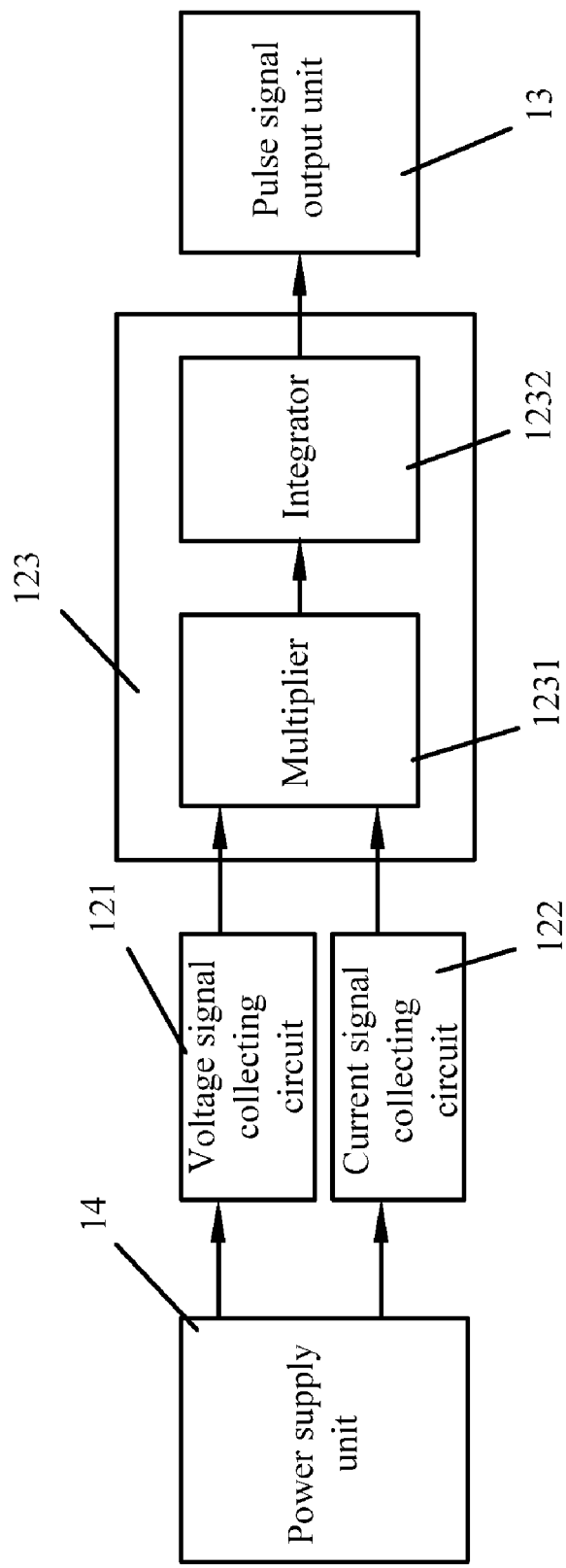
FIG. 3 is a block diagram of an energy metering unit of the invention.

As shown in FIG. 3, an energy metering unit 12 of the invention comprises a current signal collecting circuit 121, a voltage signal collecting circuit 122, and an operational and processing circuit 123. The current signal collecting circuit 121 operates to collect a current signal on the power line in real time.

The voltage signal collecting circuit 122 operates to collect a voltage signal on the power line in real time.

The operational and processing circuit 123 comprises a multiplier 1231 and an integrator 1232. The multiplier 1231 multiples the current signal by the voltage signal whereby obtaining an instant power, and the integrator 1232 obtains an energy value within a given time interval.

The pulse signal output unit 13 transforms the energy value into a pulse signal and outputs the pulse signal. In this embodiment, the pulse signal output unit 13 is a voltage/frequency conversion and frequency-division circuit.

Figure 4:
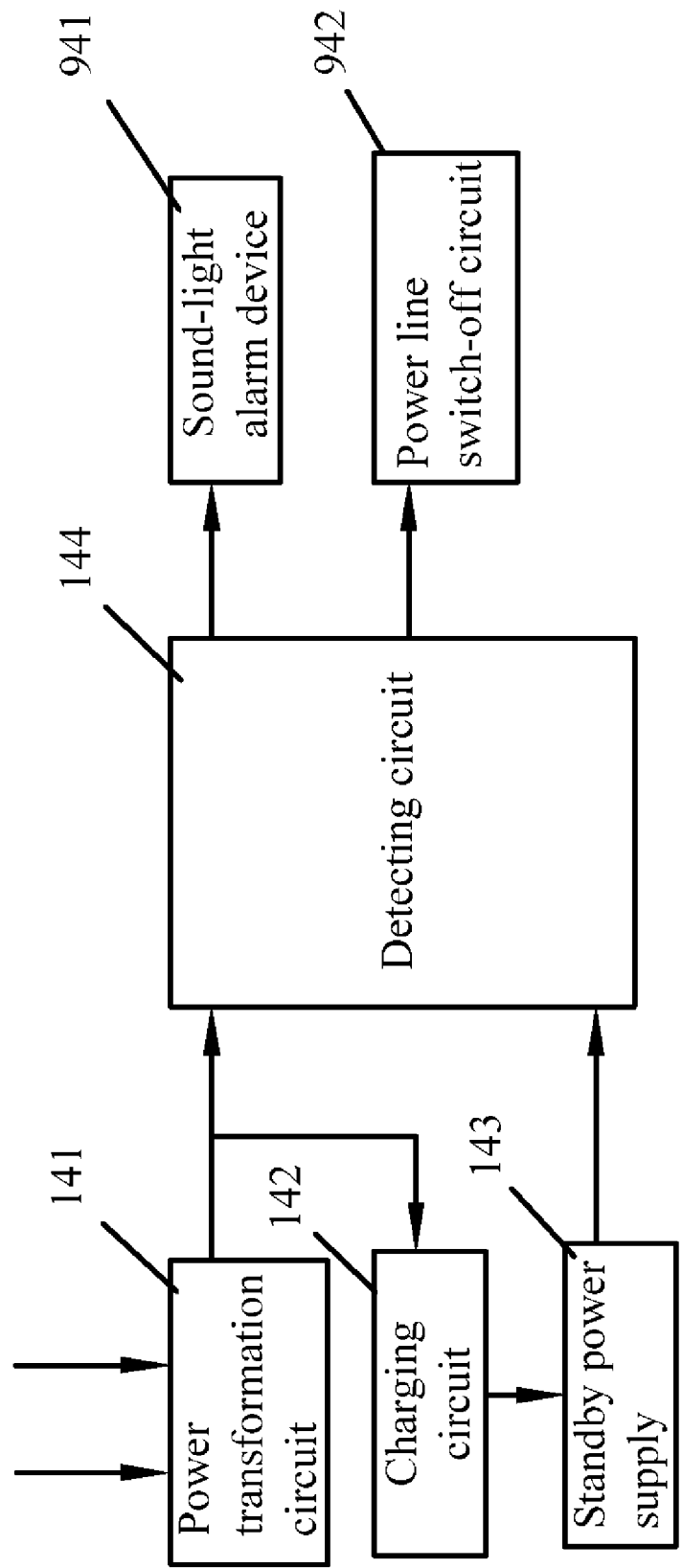
FIG. 4 is a block diagram of a power supply unit of the invention.

As shown in FIG. 4, a power supply unit 14 of the invention comprises a power transformation circuit 141, a charging circuit 142, and a detecting circuit 144.

The power transformation circuit 141 transforms voltage of the power line whereby providing operating power. The power transformation circuit 141 is connected to the phase line input end 112 and the zero line input end 111.

The charging circuit 142 is disposed between an output end of the power transformation circuit 141 and a standby power supply 143, and operates to supply power to the standby power supply 143.

The detecting circuit 144 operates to detect whether voltage is output from the power transformation circuit 141, and to enable the standby power supply 143 to supply operating power to components of the modular energy metering device 1 as no voltage is output from the power transformation circuit 141. Since capacity of the standby power supply 143 is limited, as the power transformation circuit 141 fails, users have to be informed, or the power line is to be switched off via a power-off circuit 942 (a circuit breaker), so as to prevent waste of power resource of the power sector. Alternatively, a sound-light alarm device 941 connected to the detecting circuit 144 can be used, as no voltage is output from the power transformation circuit 141, the sound-light alarm device 941 is triggered.

Figure 5A:
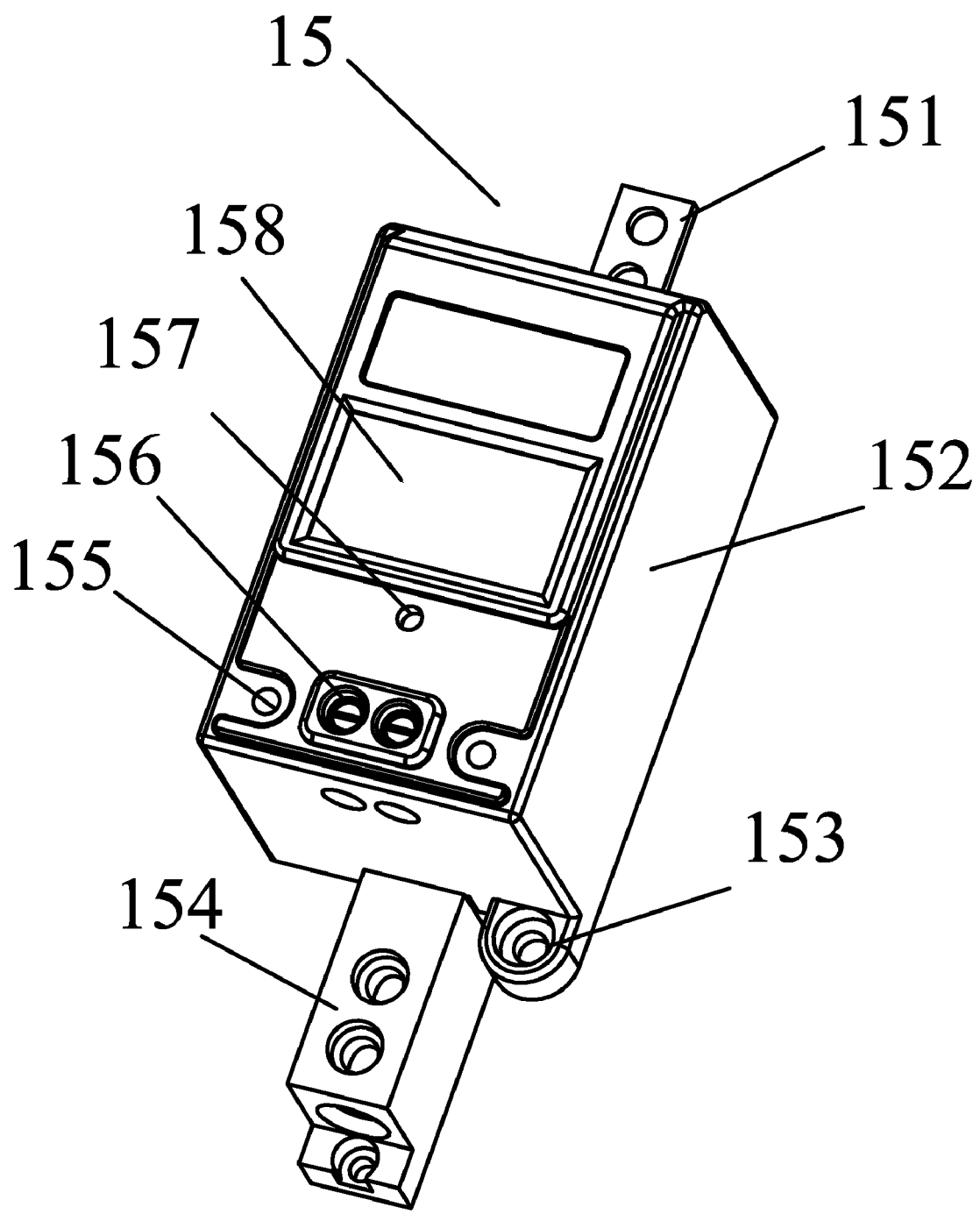
FIG. 5A is a perspective view of a box of an exemplary embodiment of the invention.

As shown in FIG. 5A, to guarantee safety of the modular energy metering device 1, a box is used. The box comprises a bottom plate 150 and a cover 152.

The bottom plate 150 operates to support components disposed in the box. The cover 152 is disposed on the bottom plate 150 and operates to protect the components disposed in the box.

A phase line input end 151 is disposed at the top of the cover 152, and a phase line output end 154 is disposed at an end opposite thereto.

A locking hole 155 is disposed on upper surface of the cover 152, and is connected to the bottom plate 150 via a screw.

A display window 158, a calibration hole 156, and an indication lamp hole 157 are disposed on the cover 152, and operate to provide mechanical interface for enhancing functionality and structure of the modular energy metering device 1.

Figure 5B:
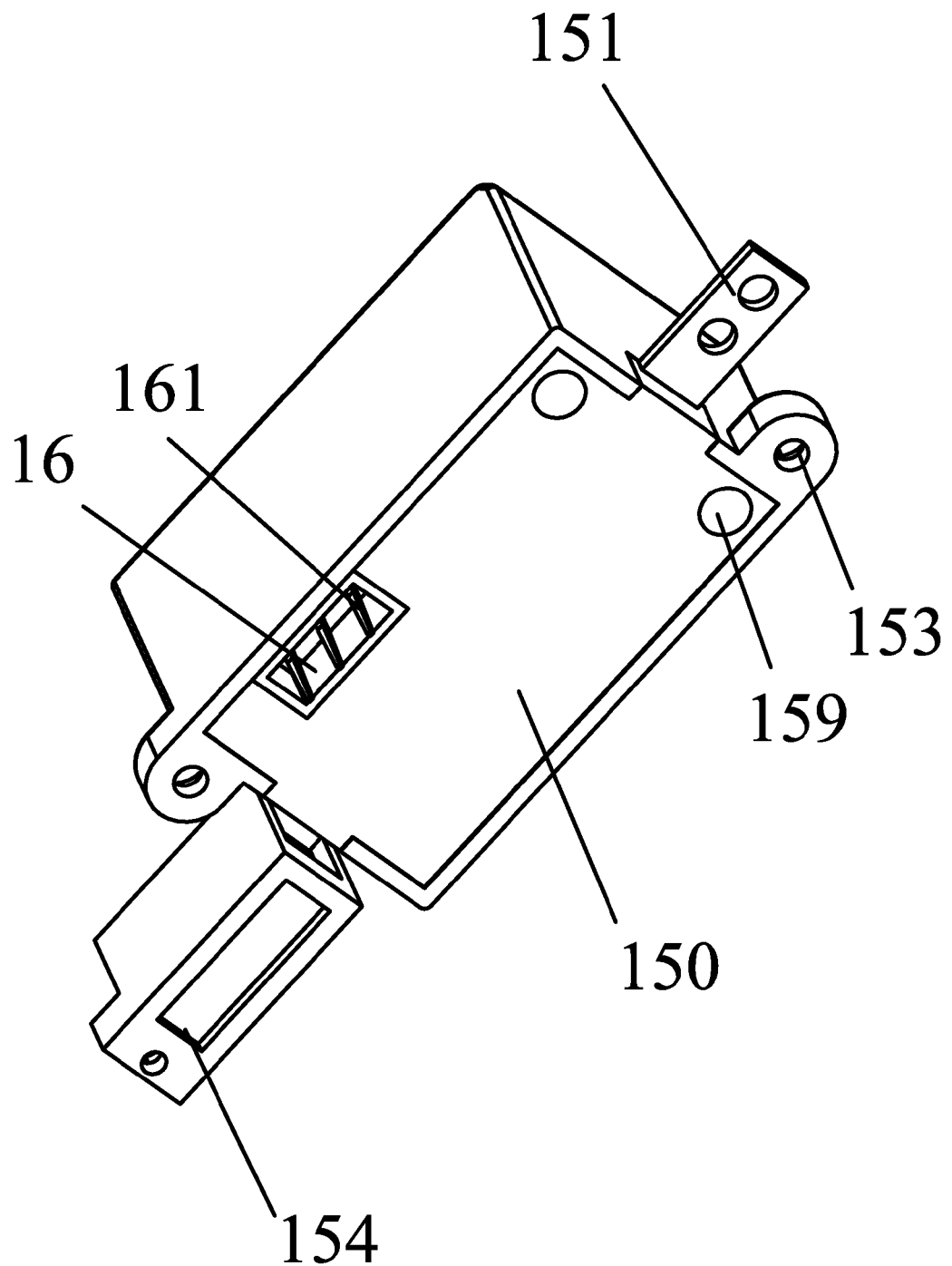
FIG. 5B is another perspective view of a box of an exemplary embodiment of the invention.

As shown in FIG. 5B, multiple fixing holes 159 are dispose on the bottom plate 150 whereby fixing and positioning the box 15. One feature of the invention is that it comprises a phase line input end 151, a phase line output end 154, and a zero line input end 161. The zero line input end 161, and an output end of the pulse signal output unit 13 are disposed on a parallel port 16 and correspond to different pins. Enhancement of functionality of the invention is implemented by pulling and plunging whereby forming assembling and connection of the modular energy meter.

Figure 5C:
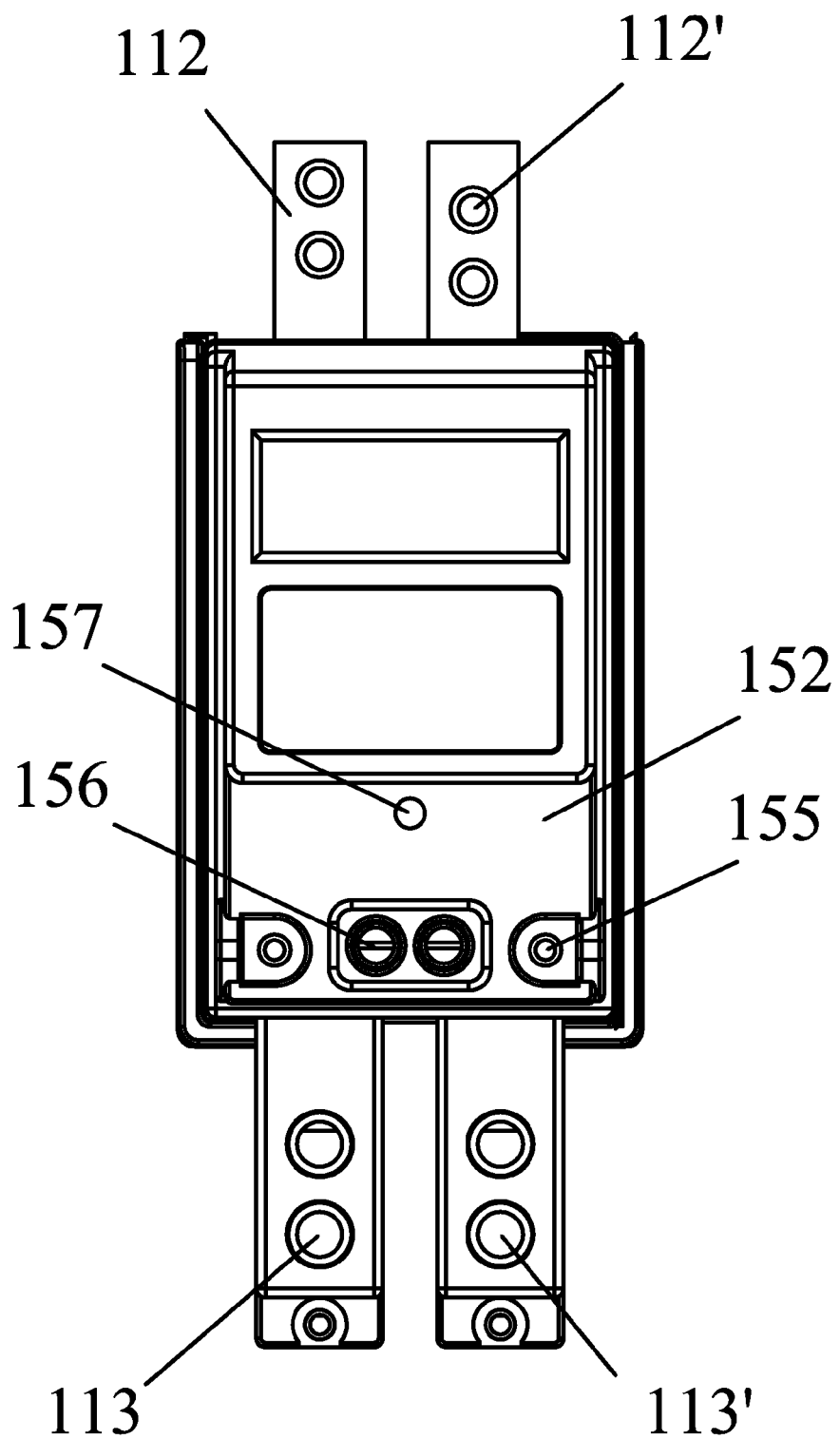
FIG. 5C is a perspective view of a box of another exemplary embodiment of the invention.

As shown in FIG. 5C, a box of another embodiment of the invention is illustrated. The difference between the box of this embodiment of the invention and that in FIG. 5A is that, a phase line input end 112, a phase line output end 113, a zero line input end 112' and a zero line output end 113' are disposed at the bottom (on the same side) of the modular energy metering device 1. A locking hole 155 is disposed on upper surface of the cover 152, and is connected to the bottom plate 150 via a screw.

A display window 158, a calibration hole 156, and an indication lamp hole 157 are disposed on the cover 152, and operate to provide mechanical interface for enhancing functionality and structure of the modular energy metering device 1.

Figure 5D:
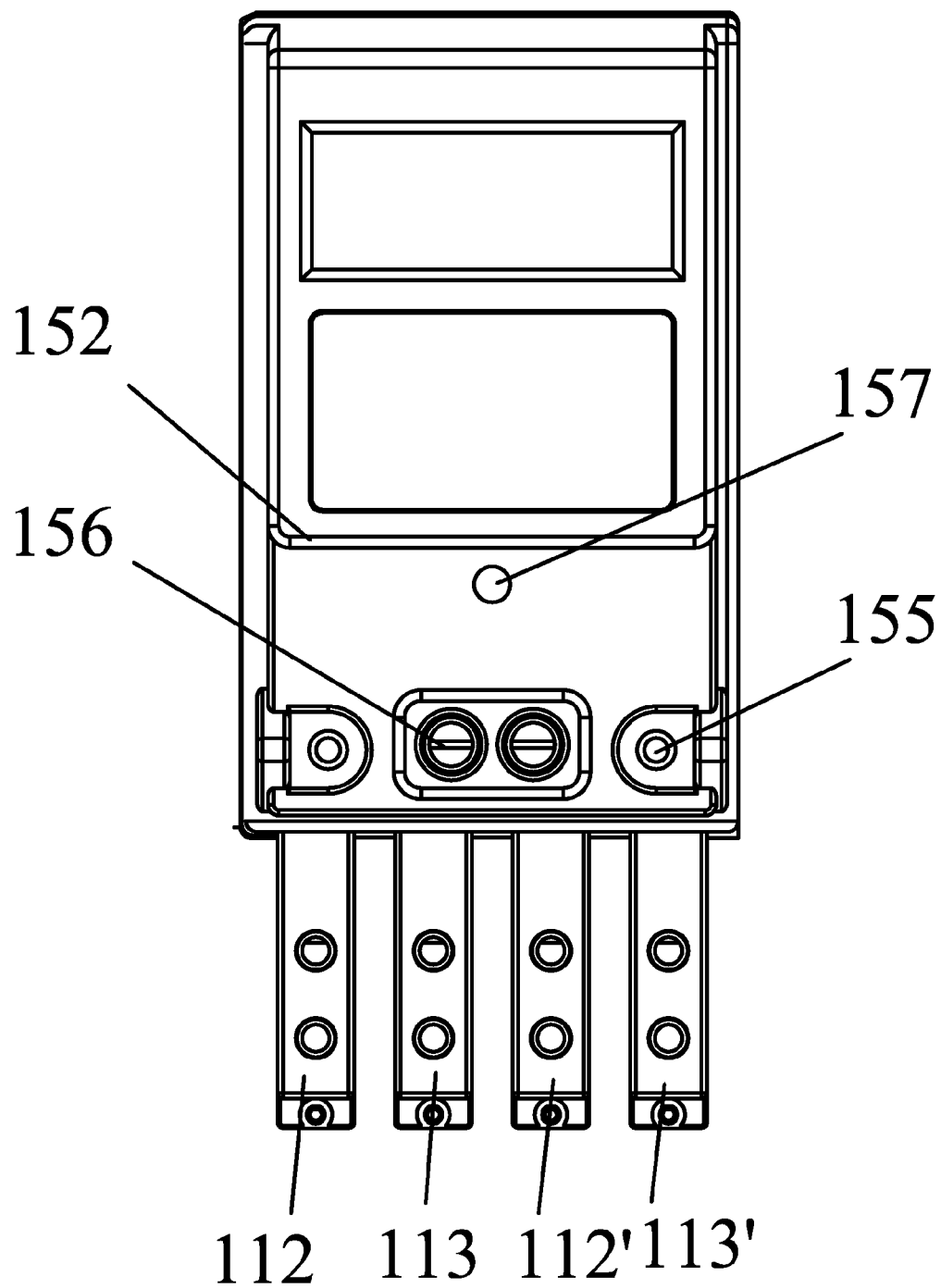
FIG. 5D is a perspective view of a box of a further exemplary embodiment of the invention.

As shown in FIG. 5D, the phase line input end 112 and the zero line input end 112' are disposed at the top of the modular energy metering device 1, and the phase line output end 113 and the zero line output end 113' are disposed at the bottom thereof.

The output end of the pulse signal output unit 13 is a parallel port disposed on the bottom plate 150 (not shown). Enhancement of functionality of the invention is implemented by pulling and plunging whereby forming assembling and connection of the modular energy meter.

Figure 6A:
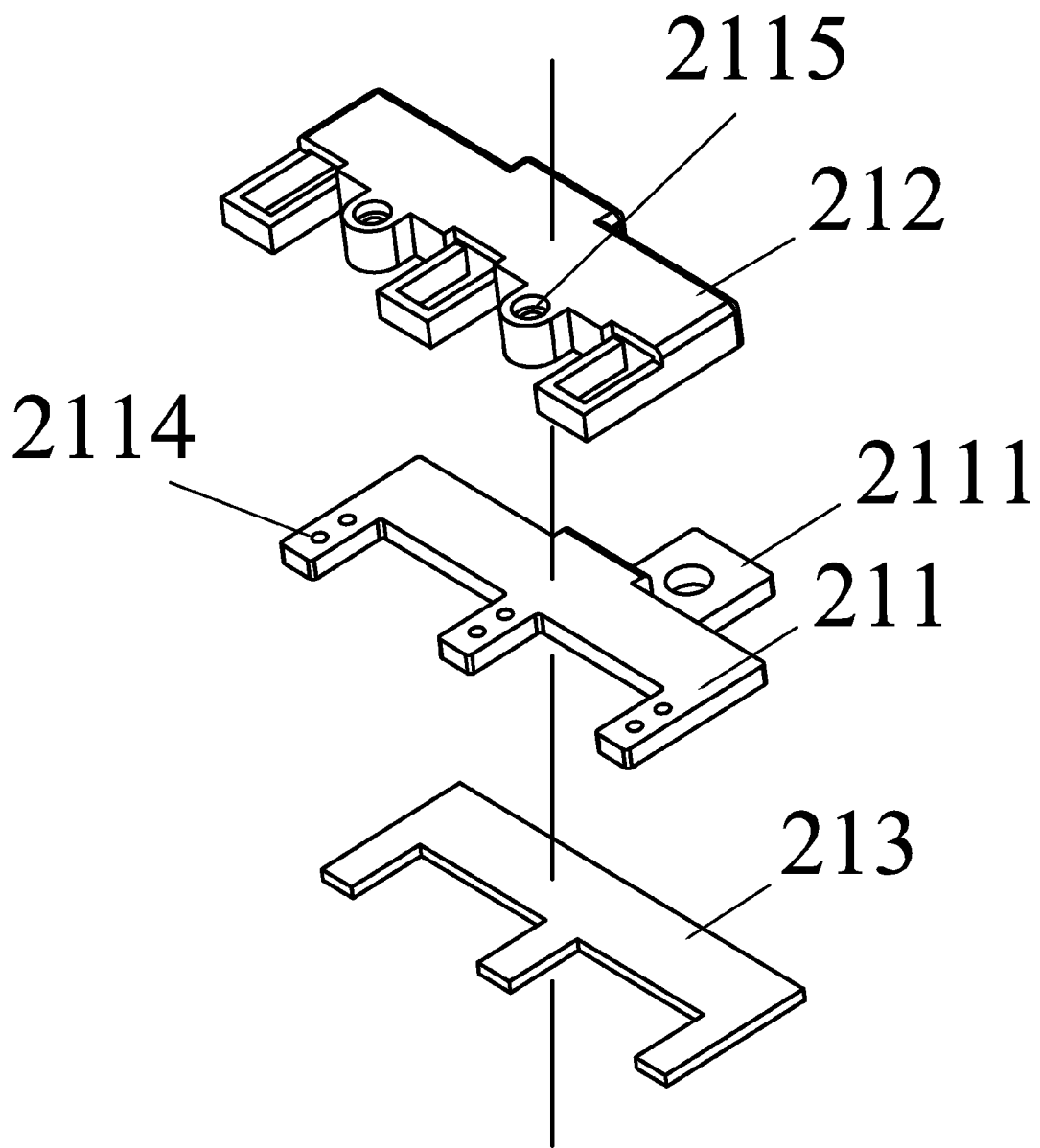
FIG. 6A is an explosive view of a phase line access portion of the invention.

As shown in FIG. 6A, a phase line access portion comprises at least a phase line access sub-portion 211, an upper shield 212, and a lower shield 213.

The phase line access sub-portion 211 is made of conductive materials, and comprises an input end 2111, at least a phase line output end 2114, and multiple screw holes 2115.

The input end 2111 of the phase line access sub-portion 211 is connected to the phase line of the power line, and the phase line output end 2114 of the phase line access sub-portion is connected to the phase line input end 112 of the modular energy metering device 1.

The screw holes 2115 is connected to a bottom plate of the case 3.

The upper shield 212 and the lower shield 213 are made of insulation materials and heat-insulating materials, and operate to shield exposed parts of the phase line access sub-portion 211 whereby preventing electric shock.

The lower shield 213 operates to prevent heating of the power line from affecting the case 3.

Figure 6B:
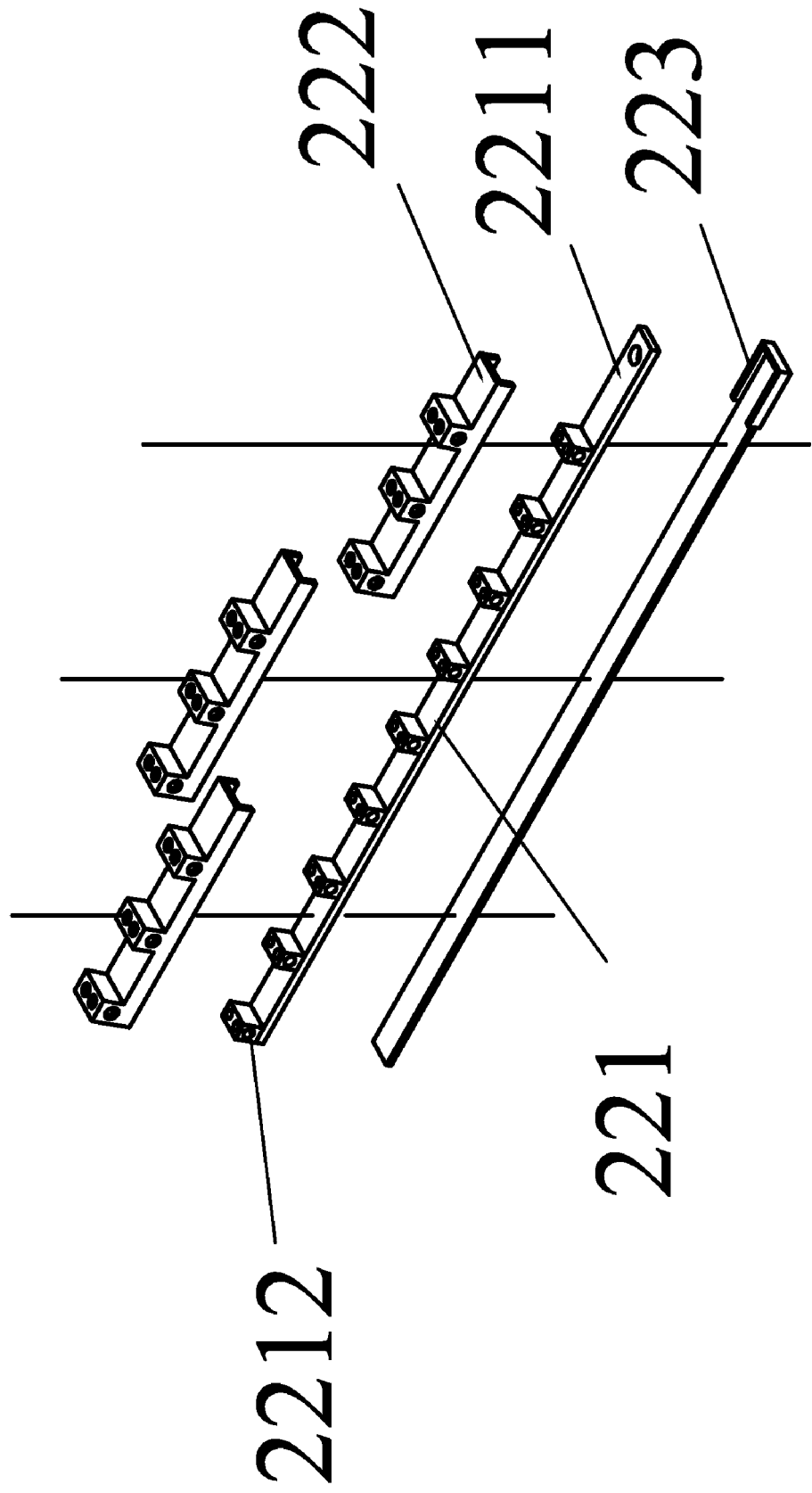
FIG. 6B is an explosive view of a zero line access portion of the invention.

As shown in FIG. 6B, the zero line access portion 22 of the modular energy meter comprises: a body 221, an upper shield 222 and a lower shield 223.

The body 221 is made of conductive materials and in the shape of a strip. The body 221 comprises an input end 2211, and at least a conductive sheet 2212. The input end 2211 is connected to a zero line of the power line. The conductive sheet 2212 is connected to the body 221, and has an output end. The number of the conductive sheet 2212 is the same as that of the modular energy metering devices 1. The conductive sheets 2212 are staggered with the phase line output ends 113 of the modular energy metering devices 1.

The upper shield 212 and the lower shield 213 are made of insulation materials and heat-insulating materials, and operate to shield exposed parts of the zero line access portion 22 whereby preventing electric shock.

Figure 7A:
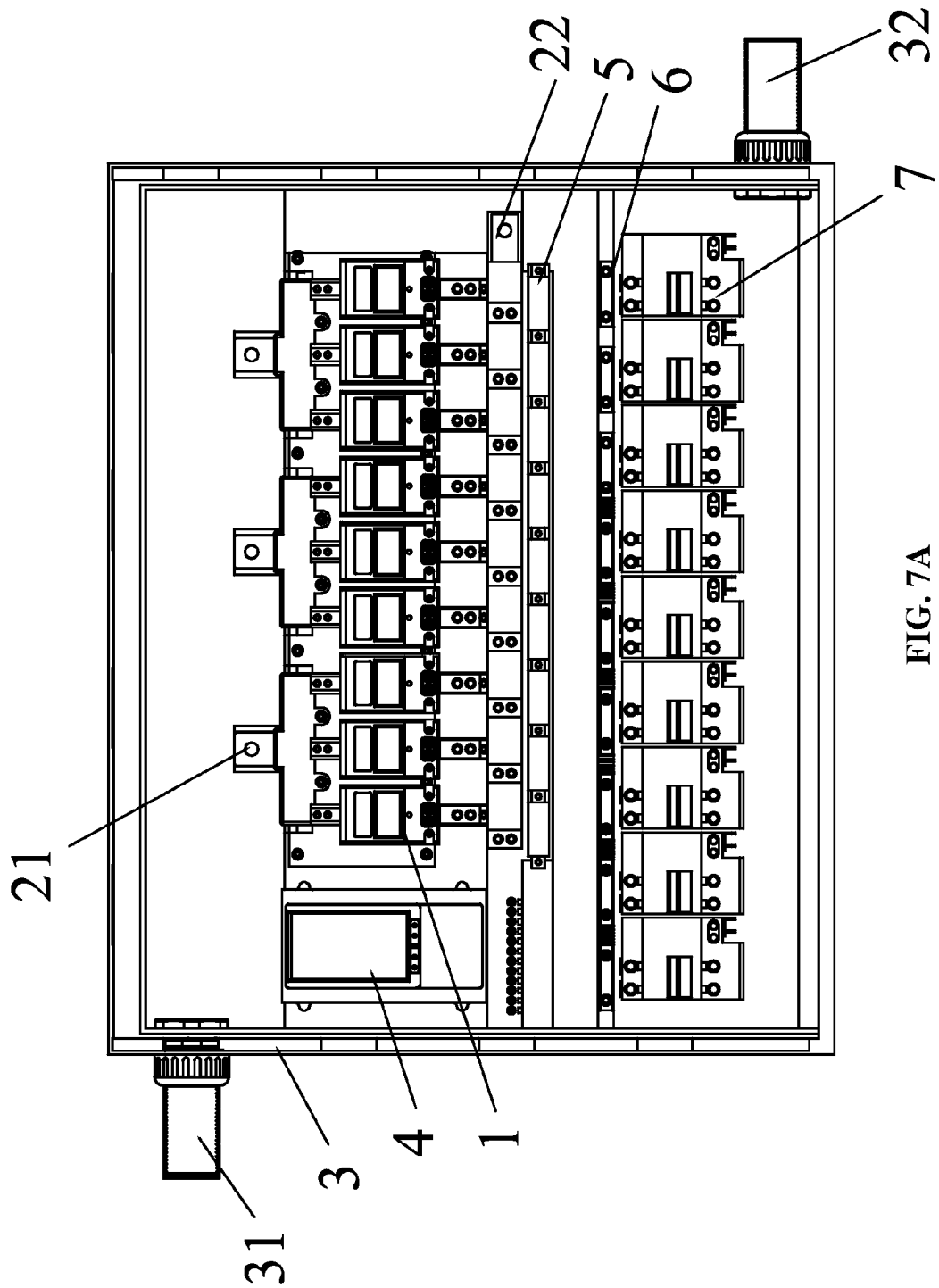
FIG. 7A is a schematic view of a modular energy meter of an exemplary embodiment of the invention.
Figure 7B:
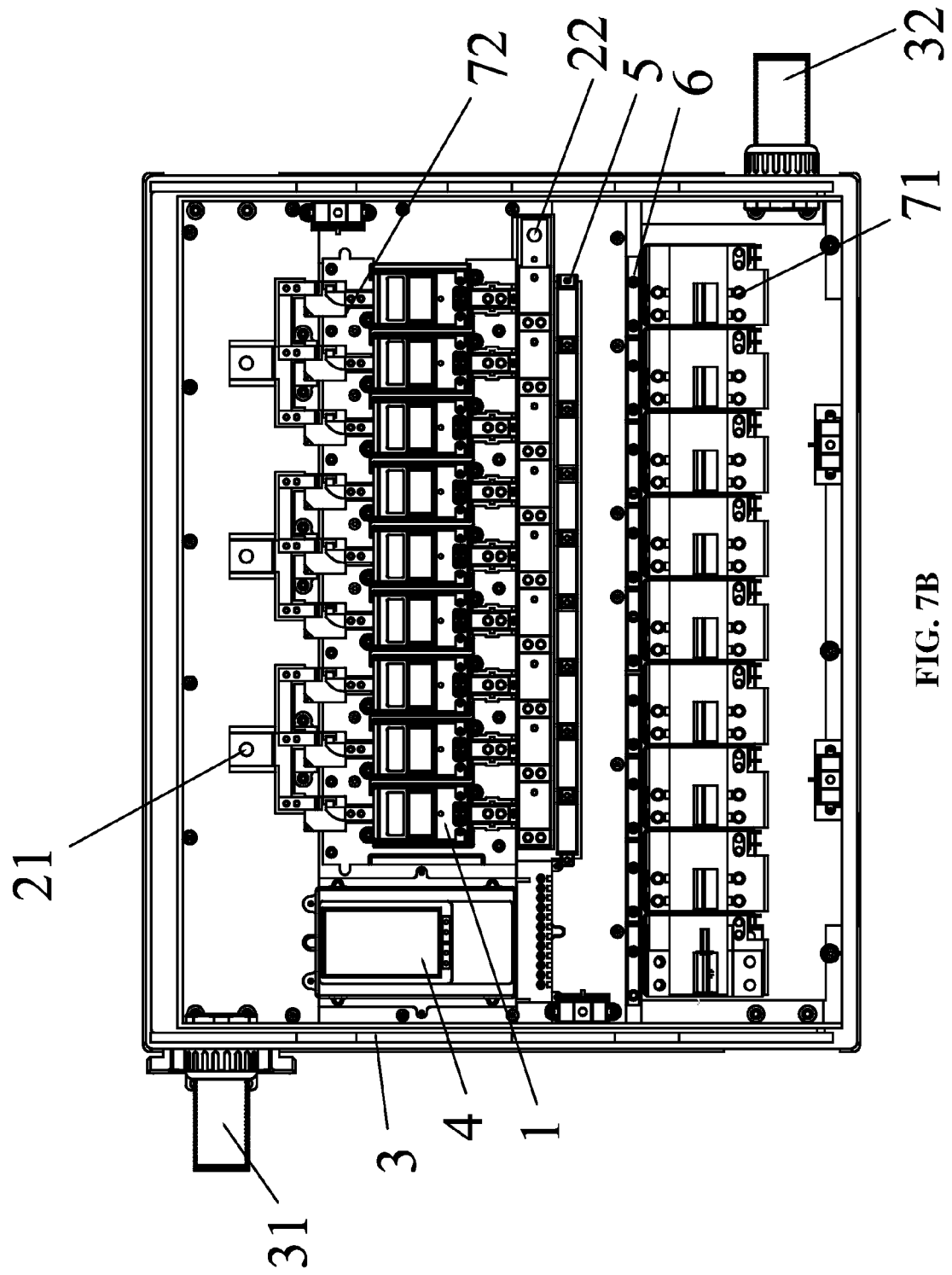
FIG. 7B is another schematic view of a modular energy meter of an exemplary embodiment of the invention.

As shown in FIGS. 7A and 7B, the power line access module and nine modular energy metering devices 1 are disposed in the case 3. The case 3 has a power line input interface 31, a zero line output interface, a phase line output interface 32, a cover (not shown), a first power-off module 71, a second power-off module 72, a line pressing portion 6, multiple current detecting portions 5, and a display module 4.

The first power-off module 71 is disposed between the phase line access portion 21 and the modular energy metering device 1, and operates to switch off a group of phase line input lines connected to a specified modular energy metering device 1. The first power-off modules 71 are at least a circuit breaker or a relay, and the number thereof is the same as that of the modular energy metering devices 1. In this embodiment, the number of the relays or the circuit breakers is 9.

The second power-off module 72 is disposed at the bottom of the case 3, and operates to switch off a group of phase line output lines, phase line output lines, or zero line output lines at a specified area. The second power-off modules 72 are at least a circuit breaker or a relay, and the number thereof is the same as that of the modular energy metering devices 1. In this embodiment, the number of the relays or the circuit breakers is 9.

It should be noted that the first power-off module 71 and the second power-off module 72 can be all disposed in the case 3, or one of the first power-off module 71 and the second power-off module 72 is disposed therein.

The line pressing portion 6 is disposed on the phase line output line connected to the phase line output end 113 of the modular energy metering devices 1, and on the zero line output line of the zero line access portion 22, whereby normalizing wire connection.

The current detecting portion 5 comprises a current detecting component and a comparator, and operates to detect whether current balance or current overload occurs. The current detecting component is disposed below the zero line access portion 22, and an output end of the comparator is connected to a status signal input end of a control module 8.

The display module 4 is disposed on the left of the case 3, and operates to inquire and display electricity consumption, prepaid charging, and use history of users.

The control module 8 of the invention operates to receive a status signal from a corresponding unit or a circuit, and to transmit a control signal thereto, whereby facilitating status monitoring of the modular energy meter. The control module 8 is a microprocessor, an embedded system, or a programmable logic device. Selection of the microprocessor, an embedded system, or a programmable logic device is determined by requirement for processed data, for functionality of the modular energy meter, and for size of the invention.

Figure 7C:
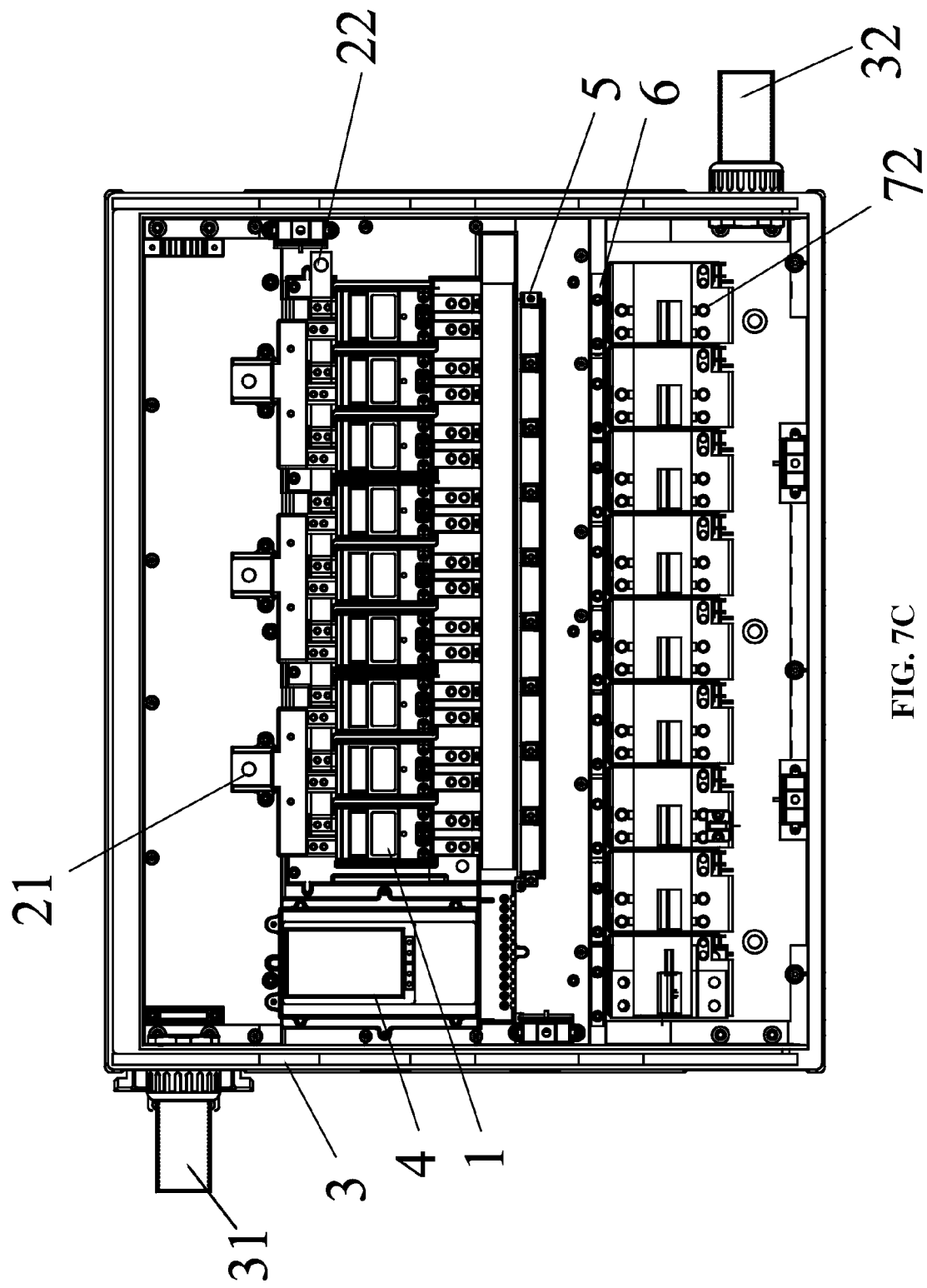
FIG. 7C is a schematic view of a modular energy meter of another exemplary embodiment of the invention.
Figure 7D:
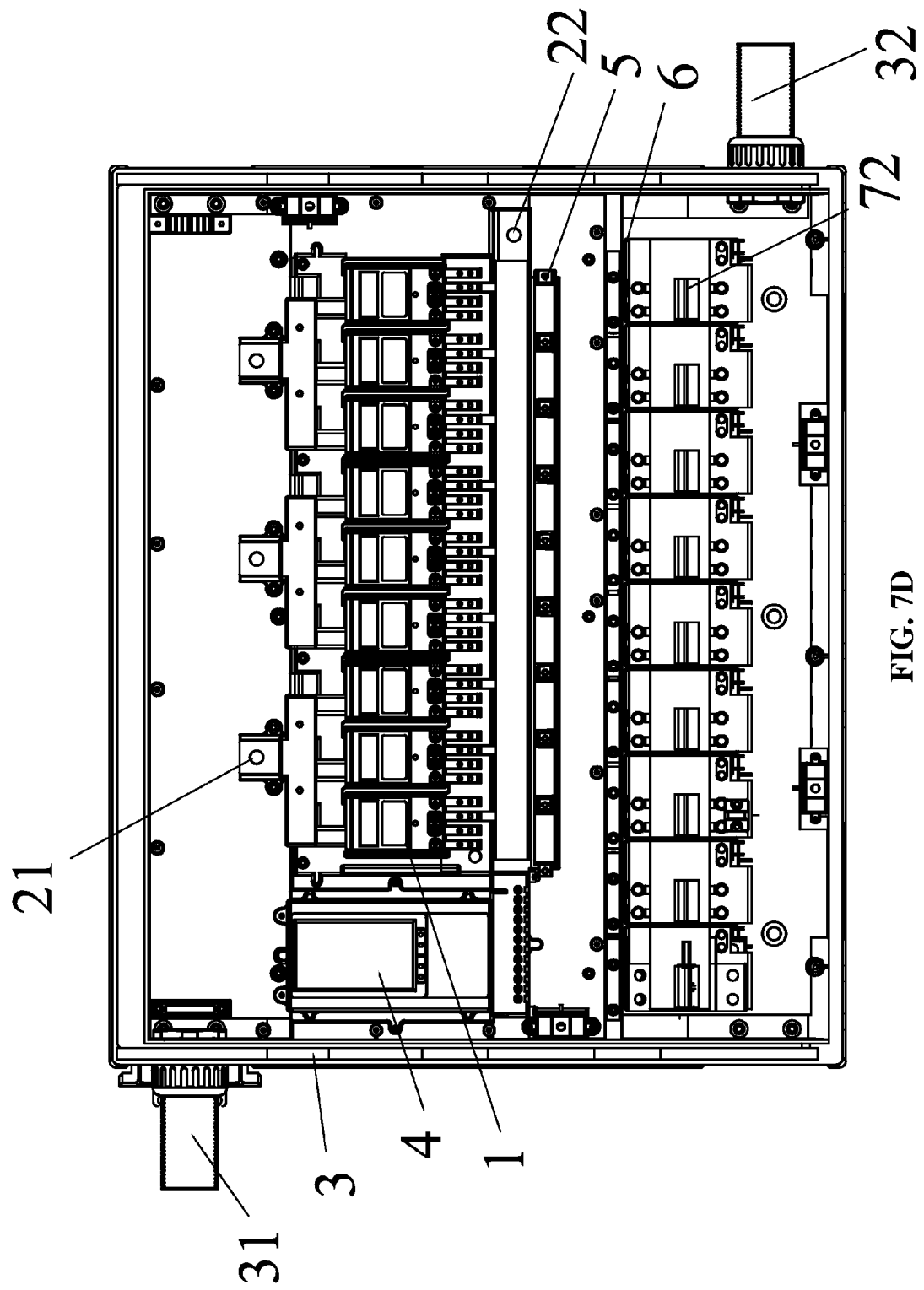
FIG. 7D is another schematic view of a modular energy meter of another exemplary embodiment of the invention.

The modular energy meter in FIGS. 7C and 7D is almost the same as that in FIGS. 7A and 7B, except that the modular energy metering device 1 has a phase line input end, a zero line input end, a phase line output end, and a zero line output end.

Figure 8:
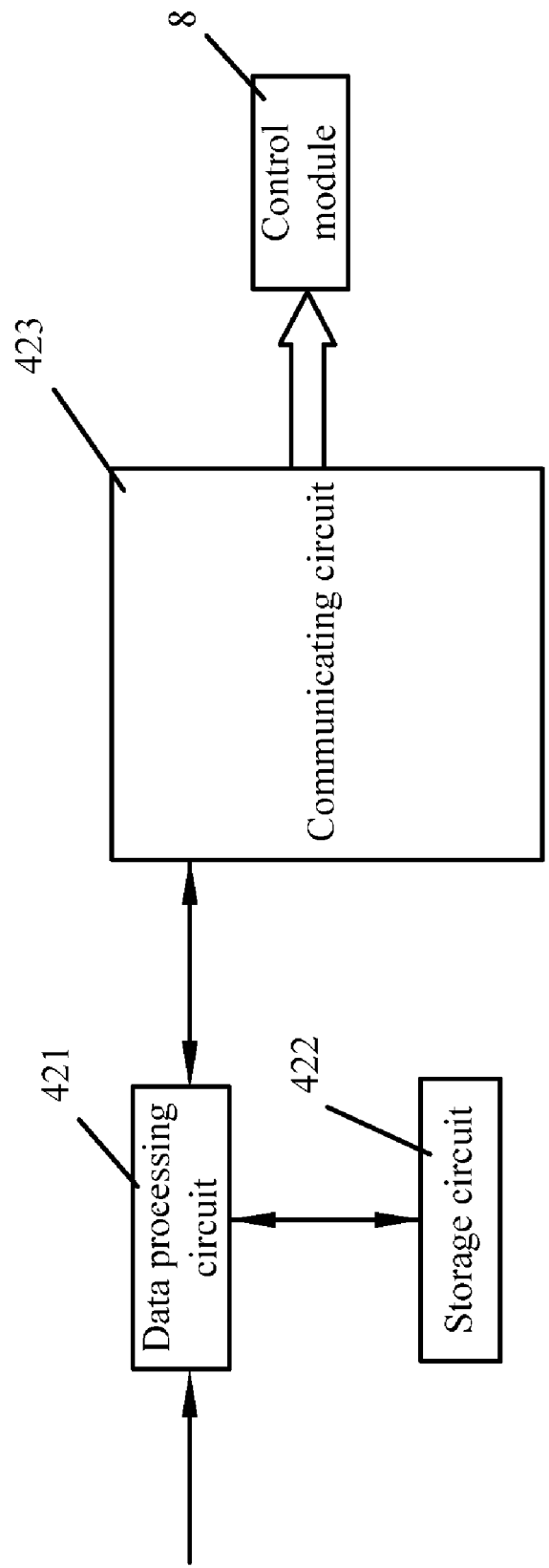
FIG. 8 is a block diagram of a counting unit of the invention.

As shown in FIG. 8, a counting unit 42 is illustrated and operates to accumulate electric energy values. The counting unit 42 comprises a data processing circuit 421, a storage circuit 422, and a communicating circuit 423.

The data processing circuit 421 operates to receive a pulse signal from the pulse signal output unit 13, and to accumulate electric energy values, or the data processing circuit 421 operates to directly receive an electric energy value signal from the energy metering unit 12.

The communicating circuit 423 operates to connect the data processing circuit 421 to the control module 8, and to transmit a status signal to the control module 8 whereby enabling the control module 8 to generate a corresponding control signal and to transmit the control signal to corresponding receiving units or circuits.

The storage circuit 422 is connected to the data processing circuit 421. As power failure occurs, the storage circuit 422 stores the accumulated electric energy value. As power recovers, the data processing circuit 421 reads the accumulated electric energy value from the storage circuit 422.

Figure 9:
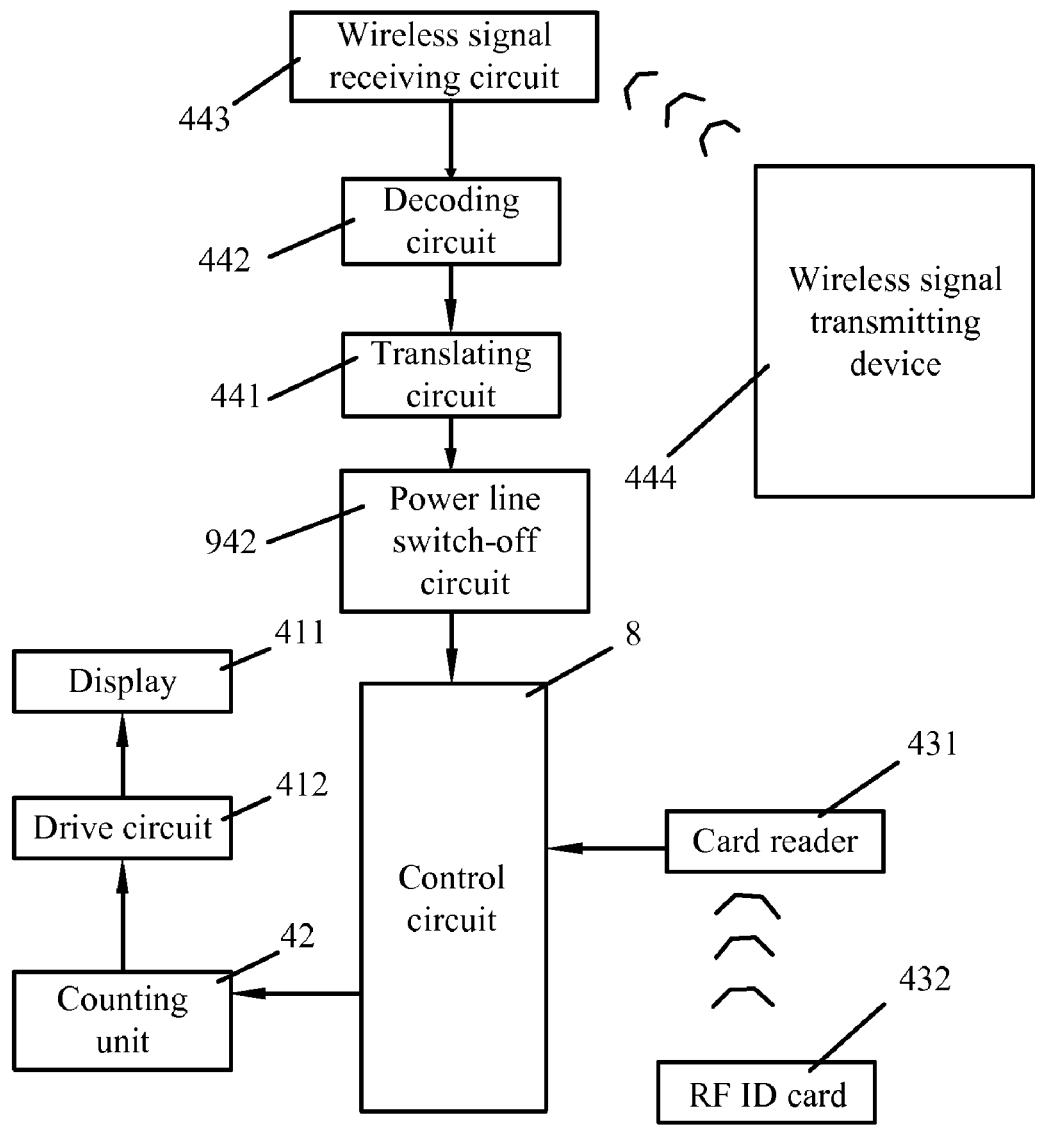
FIG. 9 is a block diagram of an integral display module of the invention.

As shown in FIG. 9, an integral display module of the invention comprises a display 411, a drive circuit 412, a card reader 431, a RF ID card 432, and a wireless control unit.

The display 411 is disposed on the case 3.

The drive circuit 412 drives the display 411 to display electricity consumption according to the data signal from the counting unit 42.

The card reader 431 is connected to the control module 8, and operates to read information from the RF ID card 432 and to transmit a data signal to the control module 8. The control module 8 generates a control signal to transmit the data signal from the counting unit 42 to the drive circuit 412. In this embodiment, the RF ID card 432 is an electricity purchasing card, or an inquiry card.

The electricity purchasing card transmits a RF ID instruction to the card reader 431, and the purchased electricity quantity to the control module 8. After the control module 8 transmits a status signal to the counting unit 42 and the storage circuit 422 of the counting unit 42 stores the purchased electricity quantity, difference between the purchased electricity quantity and the electricity consumption of the data processing circuit 421 is displayed via the display unit.

As the difference is less than a threshold value, the relay and/or the circuit breaker of the first power-off module 71 are/is switched off, and power supplying to users is stopped. The electricity purchasing card transmits a RF ID instruction to the card reader 431, and the control module 8 transmits a control instruction whereby resetting the relay and/or the circuit breaker of the first power-off module 71.

The inquiry card transmits a RF ID instruction to the card reader 431, and the control module 8 transmits a control signal to the counting unit 42 whereby enabling the display unit to display historical electricity consumption stored in the storage circuit 422 of the counting unit 42.

The wireless control unit operates to reset the relay and/or the circuit breaker, and comprises a wireless signal transmitting device 444, a wireless signal receiving circuit 443, a decoding circuit 442, and a translating circuit 441.

The wireless signal transmitting device 444 operates to transmit a wireless control signal.

The wireless signal receiving circuit 443 operates to receive a wireless control signal from outside.

The decoding circuit 442 is connected to the wireless signal receiving circuit 443 whereby obtaining a digital control signal therefrom.

The translating circuit 441 operates to parse the digital control signal and to transform the digital control signal into command information whereby controlling resetting or switch-off of the relay and/or the circuit breaker.

For a user wishing to read his/her electricity consumption without a ID card, an independent display module is used.

Figure 10A:
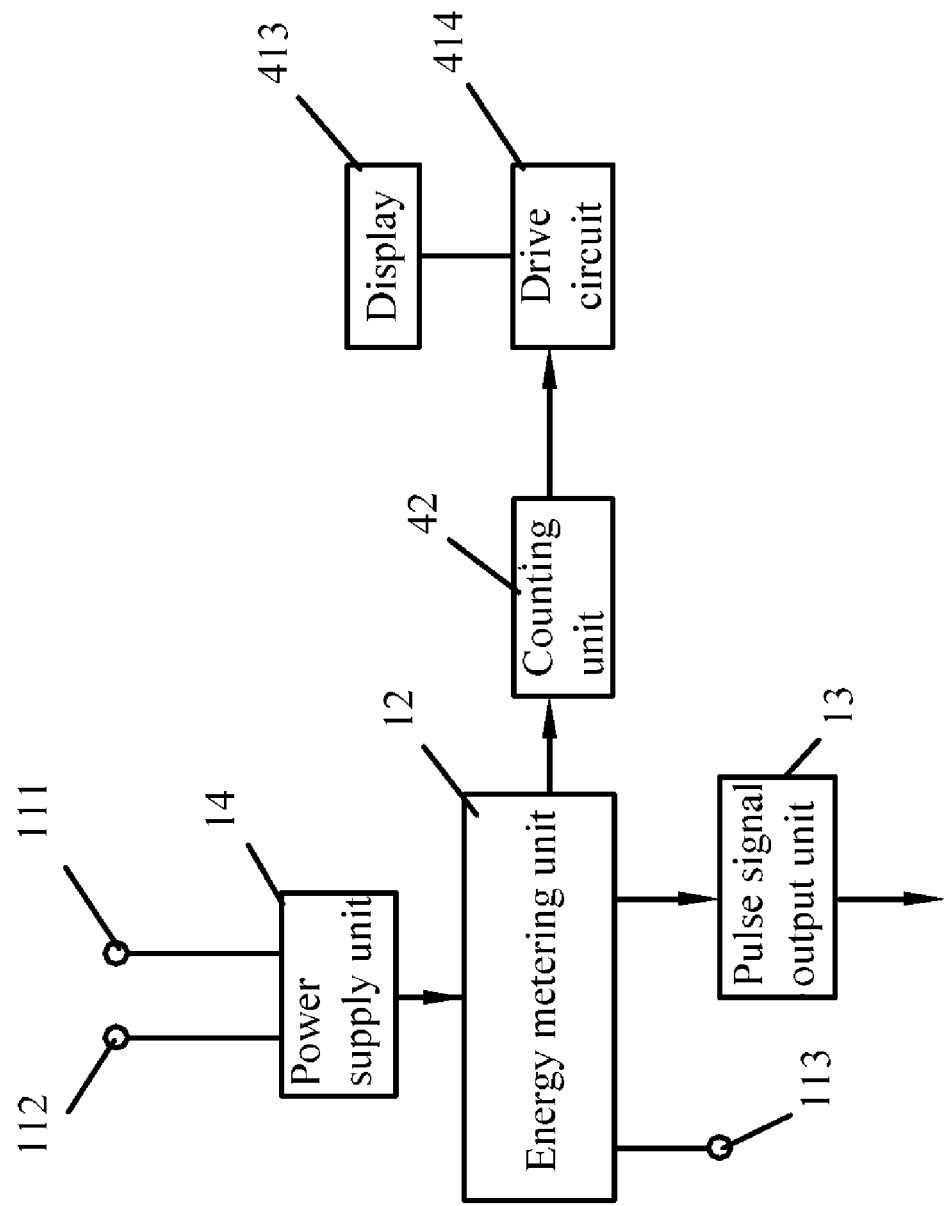
FIG. 10A is a block diagram of an independent display module of an exemplary embodiment of the invention.

As shown in FIG. 10A, a counting unit 42 and a display unit are added to the modular energy metering devices 1. The counting unit 42 is connected to the output end of the energy metering unit, and accumulates signals therefrom whereby generating a data signal.

The display unit receives the data signal, and displays accumulated electricity consumption of users via the modular energy metering device 1.

The display unit comprises a display 413 and a drive 414. The display 413 is disposed on a box 15 of the modular energy metering device 1.

The drive circuit 414 drives the display 413 to display electricity consumption according to the data signal from the counting unit 42.

Figure 10B:
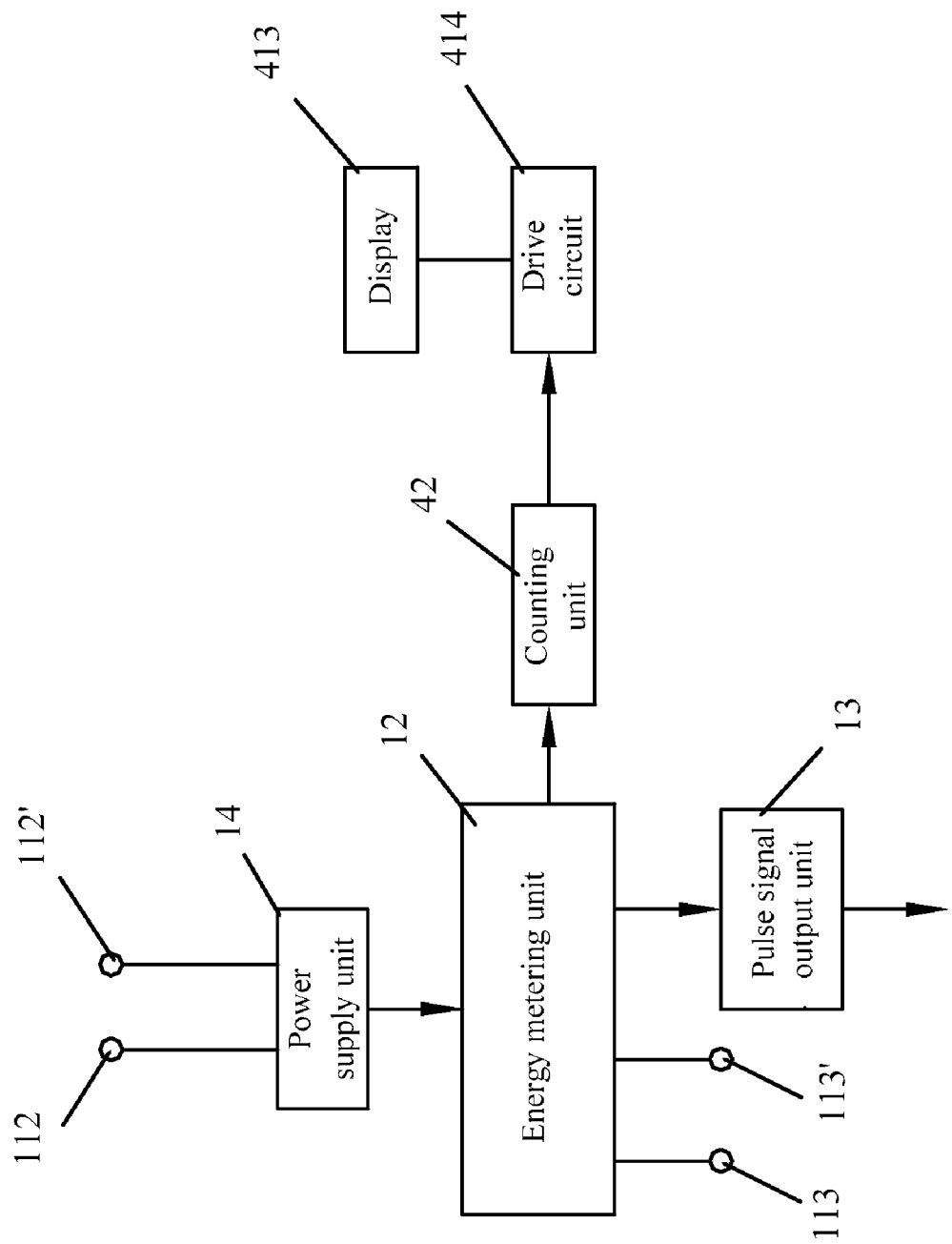
FIG. 10B is a block diagram of an independent display module of another exemplary embodiment of the invention.

As shown in FIG. 10B, the independent display module of another embodiment of the invention is almost the same as that in FIG. 10A, except that the modular energy metering device 1 has a phase line input end, a zero line input end, a phase line output end, and a zero line output end.

Figure 11A:
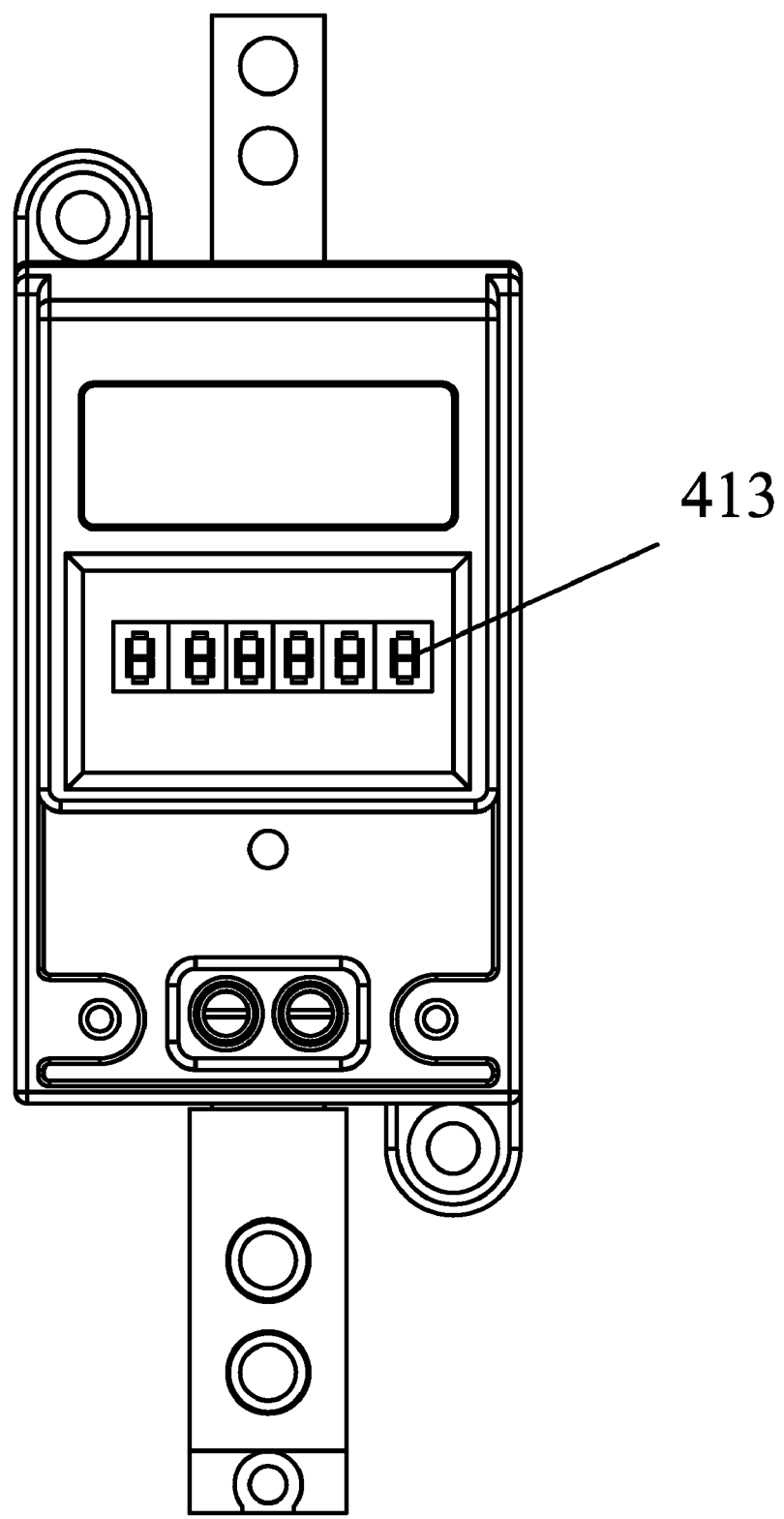
FIG. 11A is a schematic view of a modular energy metering device with an independent display module of an exemplary embodiment of the invention.

As shown in FIG. 11A, a modular energy metering device with an independent display module of an embodiment of the invention is shown. The independent display module has a display 413.

Figure 11B:
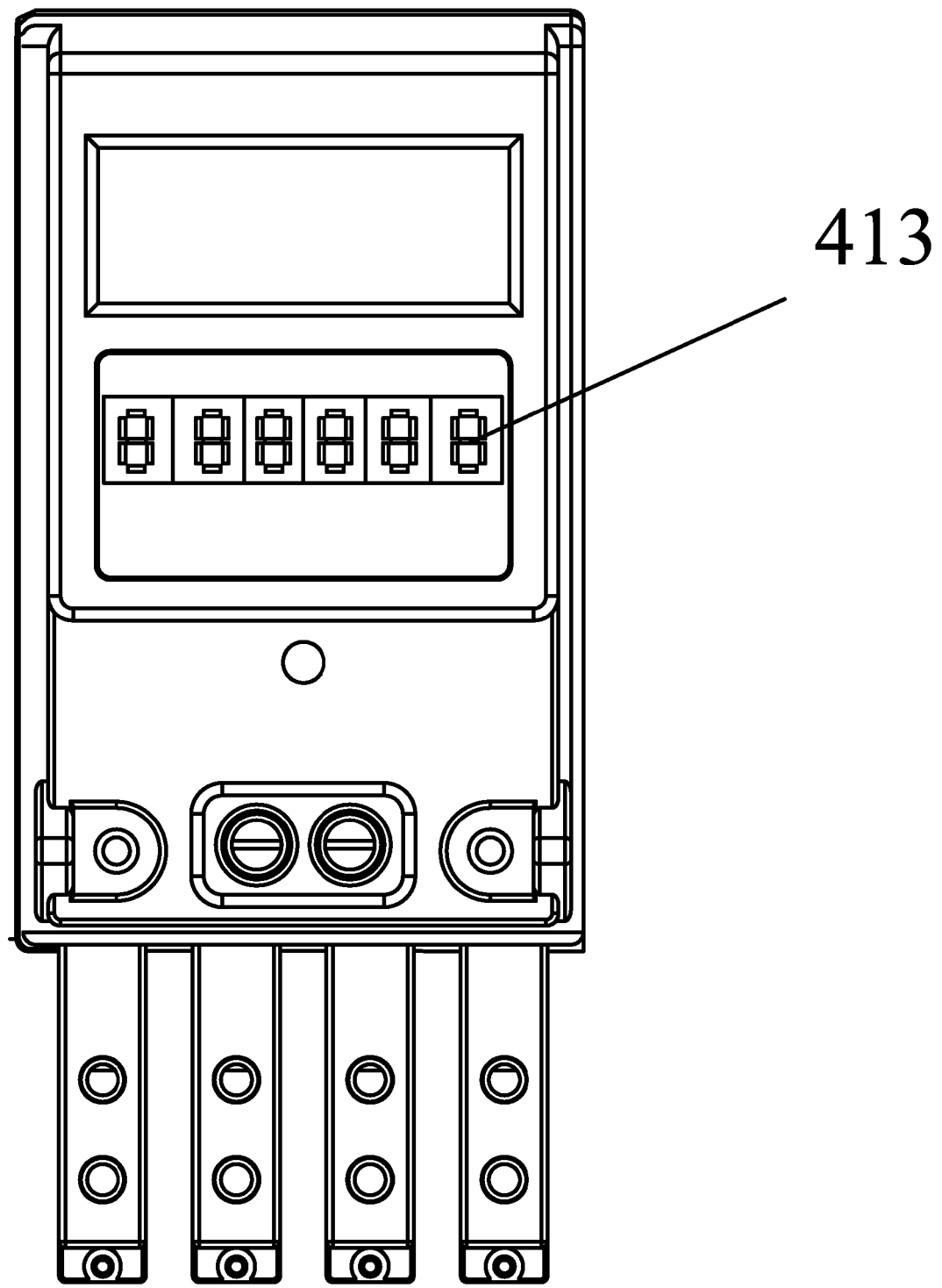
FIG. 11B is a schematic view of a modular energy metering device with an independent display module of another exemplary embodiment of the invention.

As shown in FIG. 11B, a modular energy metering device with an independent display module of another embodiment of the invention is shown. The modular energy metering device 1 in this embodiment is almost the same as that in FIG. 11A, except that the modular energy metering device 1 has a phase line input end, a zero line input end, a phase line output end, and a zero line output end.

Figure 12:
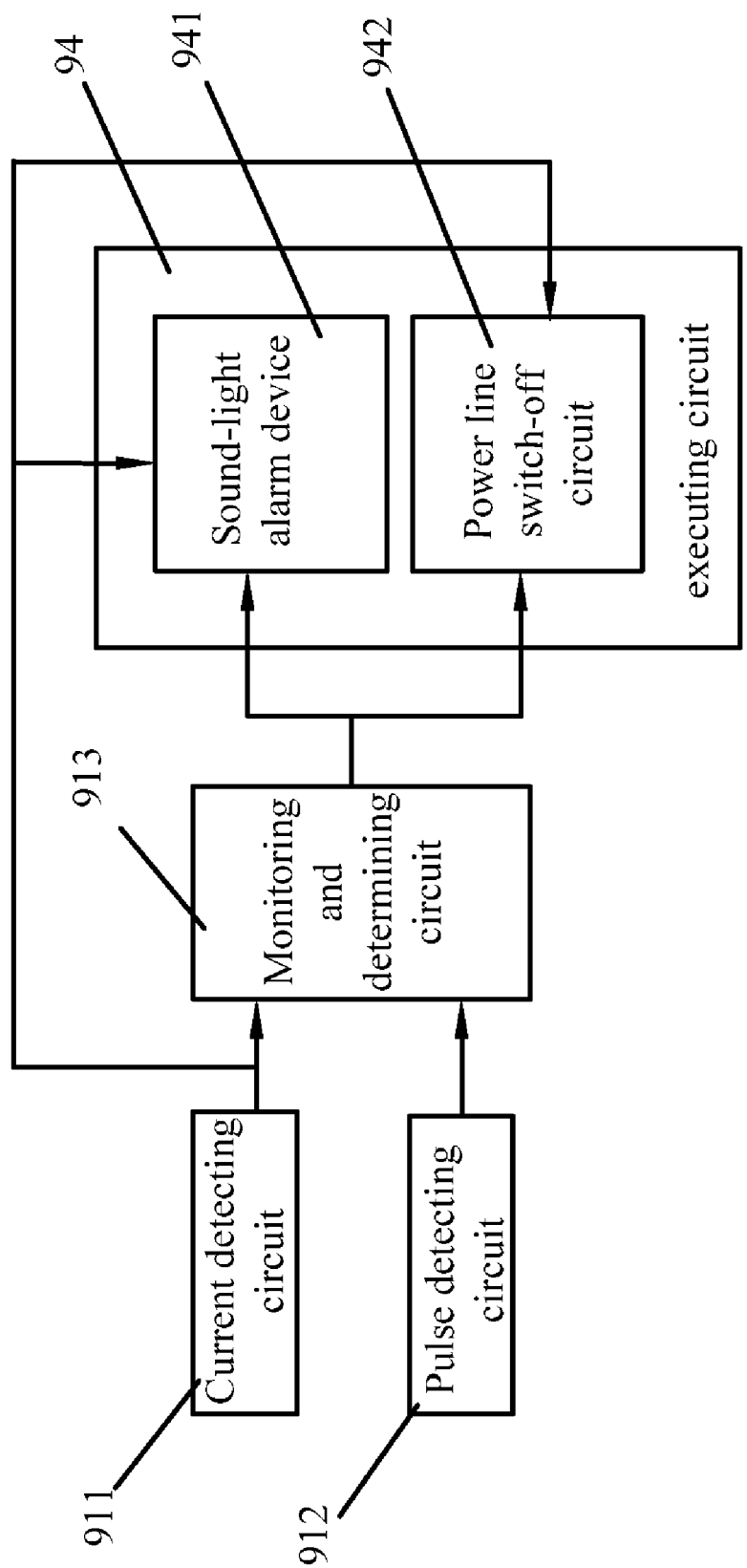
FIG. 12 is a block diagram of a failure detecting unit of the invention.

As shown in FIG. 12, a failure detecting unit is illustrated. The failure detecting unit facilitates self-test of the invention, and comprises a current detecting circuit 911, a pulse detecting circuit 912, and a monitoring and determining circuit 913.

The current detecting circuit 911 operates to detect whether current flows through the phase line input end 112.

The pulse detecting circuit 912 operates to detect whether a pulse signal flows through the pulse signal output unit 13.

The monitoring and determining circuit 913 determines the modular energy metering device 1 fails as current flows through the phase line input end 112 and no pulse signal flows through the pulse signal output unit 13.

To facilitate an optimum self-test effect, an executing circuit 94 operates along with the failure detecting unit. The executing circuit 94 comprises a sound-light alarm device 941, and a power line switch-off circuit 942.

As the above-mentioned failure of the modular energy metering device 1 occurs, the sound-light alarm device 941 operates and informs users of the failure.

The power line switch-off circuit 942 employs a circuit breaker, and is disposed on the power line. As non-outage failure occurs, power supplying to users is stopped. It should be noted that a switching circuit 114 and a corresponding executing circuit 94 can be the second power-off module as described above, and will not be described hereinafter.

Figure 12A:
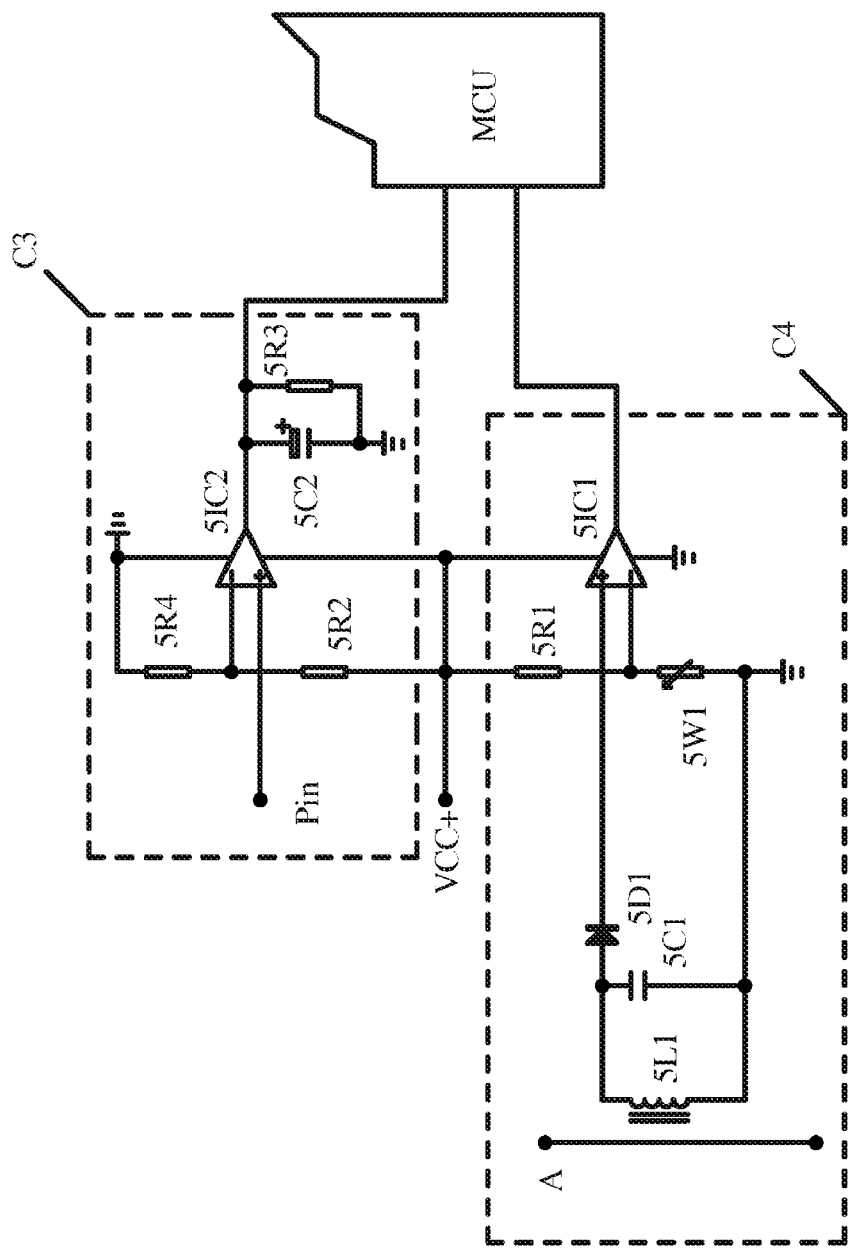
FIG. 12A is a schematic view of a failure detecting circuit of the invention.

As shown in FIG. 12A, a current detecting circuit C4 comprises an inductance coil 5L1, and a comparator 5IC1.

The inductance coil 5L1 is disposed on a phase line A.

A reference voltage is set at a reversed input end of the comparator 5IC1, an in-phase input end is connected to an output end of the inductance coil 5L1.

As current flows through the phase line A, an inductive voltage signal is compared with the reference voltage at the reversed input end of the comparator 5IC1, whereby enabling the output end of the comparator 5IC1 to output a voltage signal. Whether there is current flowing through the power line is determined by the voltage signal.

The pulse detecting circuit C3 comprises a comparator 5IC2.

A reference voltage is set at a reversed input end of the pulse detecting circuit C3, and an in-phase input end thereof is connected to an output end of the pulse signal output unit 4. An output end of the comparator 5IC2 is connected to the monitoring and determining circuit 913.

The monitoring and determining circuit 913 is the control module, an input interface thereof is connected to the output end of the current detecting circuit C4, and another input interface thereof is connected to the output end of the pulse detecting circuit C3. As the in-phase input end of the comparator 5IC2 of the pulse detecting circuit receives a pulse signal, it outputs a high potential, and the comparator 5IC1 of the current detecting circuit outputs a high potential to the control module. After the current detecting circuit inputs a high potential to the control module, if there is no high potential output to the control module from the pulse detecting circuit in a given time interval, the modular energy metering device fails.

Figure 13A:
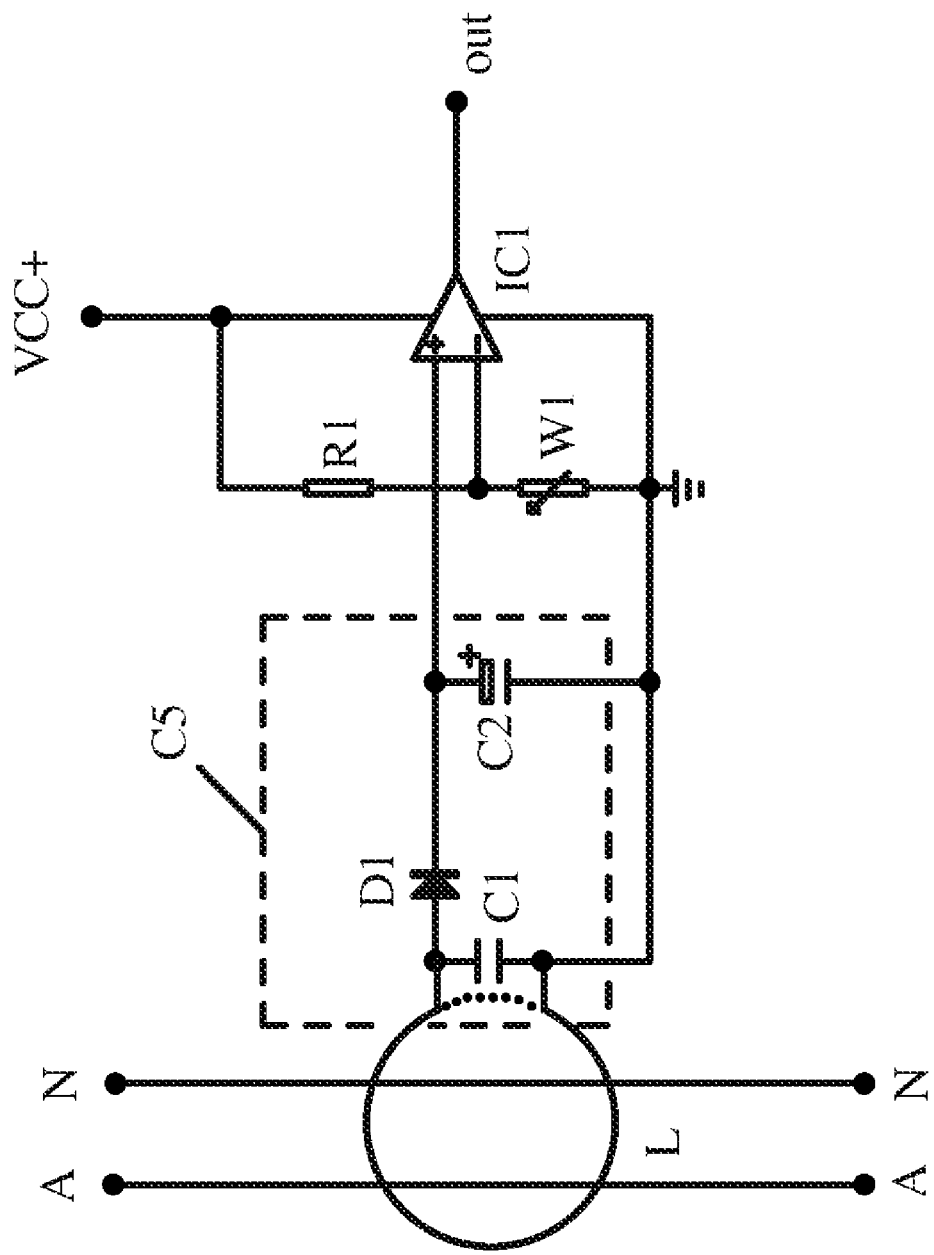
FIG. 13A is a schematic view of a current detecting module of an exemplary embodiment of the invention.

As shown in FIG. 13A, for single-phase current, to detect whether the current balances, to prevent the current from hurting operators, and to avoid waste of electricity energy, a mutual inductance coil L as a current detecting component is disposed on a live wire output line A and the zero line output line N, and transmits an inductive signal to the in-phase input end of the comparator IC1 via a rectifying circuit C5. A reference voltage is set on a reversed input end of the comparator IC1. As current imbalance occurs, the output end of the comparator IC1 outputs a high potential signal. At this time an instruction for switching off the power line can be transmitted to the relay.

Figure 13B:
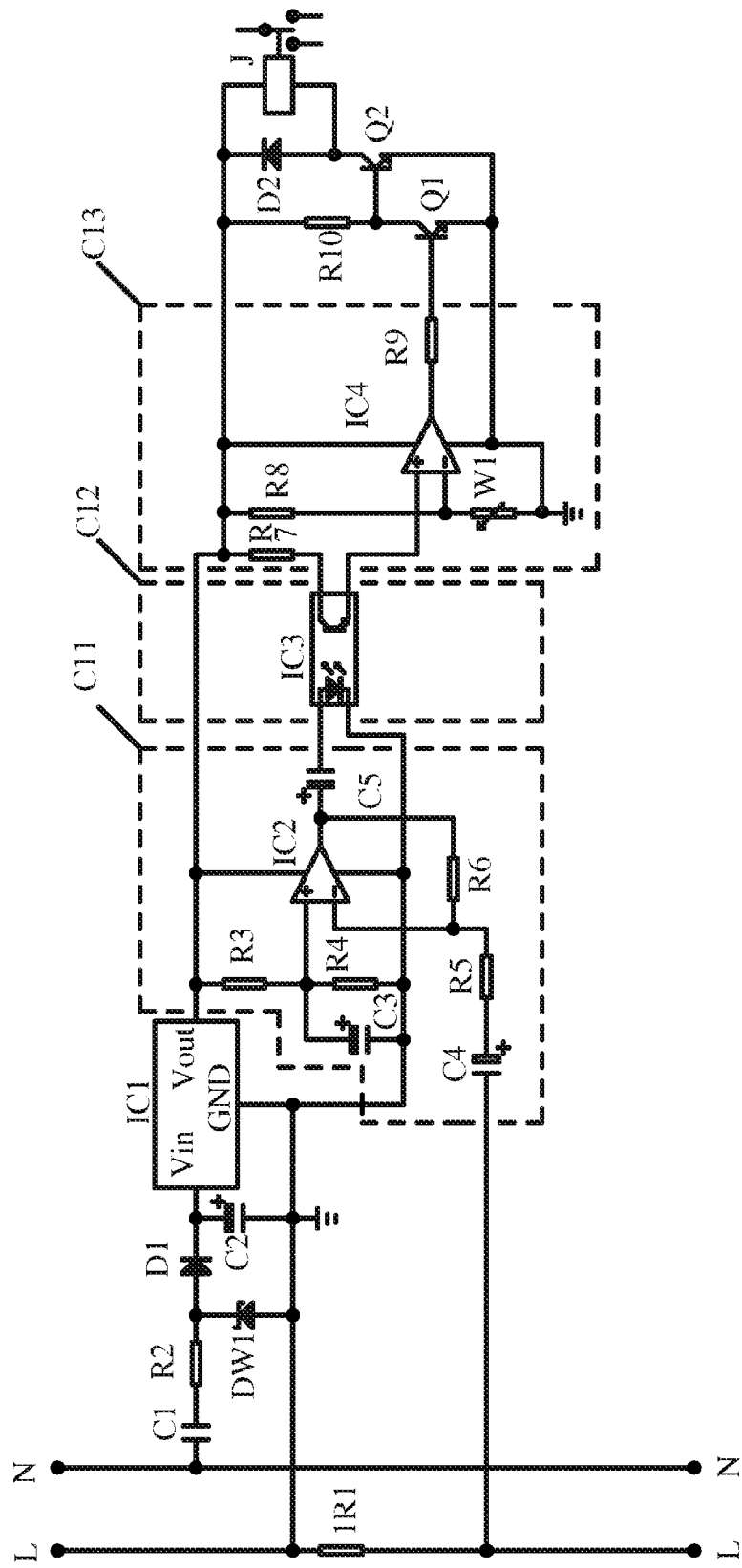
FIG. 13B is a schematic view of a current detecting module of another exemplary embodiment of the invention.

As shown in FIG. 13B, for single-phase current, to detect whether the current balances, to prevent the current from hurting operators, and to avoid waste of electricity energy, a first manganin sheet R1 and a second manganin sheet R11 respectively connected to the live wire output line A and the zero line output line N are used as current detecting components. A first voltage is generated on both ends of the first manganin sheet R1, and a second voltage is generated on both ends of the second manganin sheet R11. The first voltage is transmitted to the in-phase input end of a comparator C9 via a signal amplifying circuit C7 and an optical coupling isolator C8. The second voltage is transmitted to the reversed input end of a comparator C9 via a signal amplifying circuit C10 and the optical coupling isolator C8.

As the first voltage is not equal to the second voltage, the output end of the comparator IC4 outputs a high potential signal indicating current imbalance occurs. At this time an instruction for switching off the power line can be transmitted to the relay J.

Figure 13C:
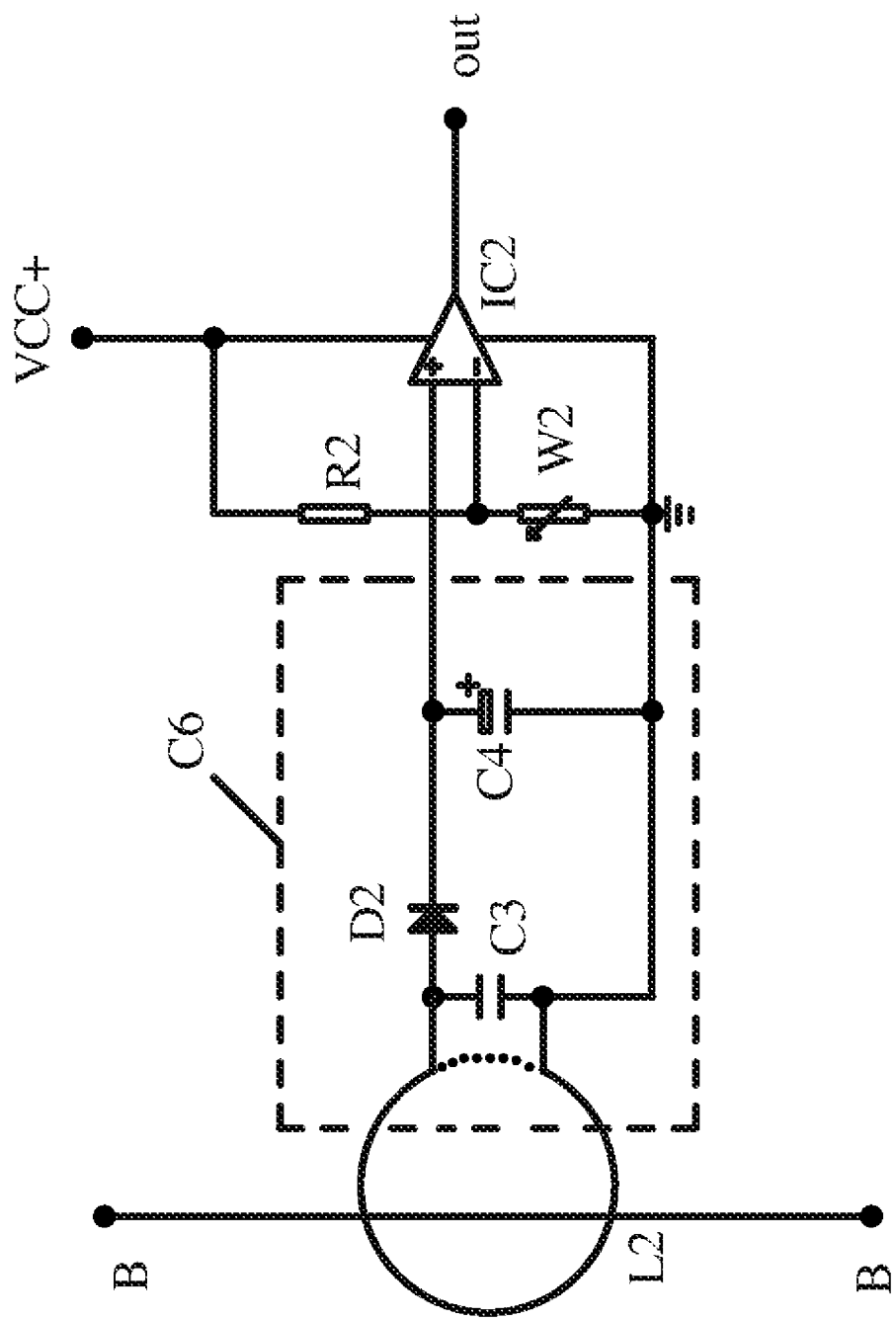
FIG. 13C is a schematic view of a current detecting module of a further exemplary embodiment of the invention.

As shown in FIG. 13C, for single-phase current, to detect whether voltage overload occurs and to prevent fire cause thereby, a mutual inductance coil L2 as a current detecting component is disposed on a live wire output line B, and a obtained inductive signal is transmitted to an in-phase input end of a comparator IC2 via a rectifying circuit C6. A reference voltage is set at a reversed input end of the comparator IC2. As overload occurs, the output end of the comparator IC2 outputs a high potential signal indicating an electric device in use exceeds a rated load. At this time an instruction for switching off the power line can be transmitted to the relay and/or the circuit breaker.

Figure 13D:
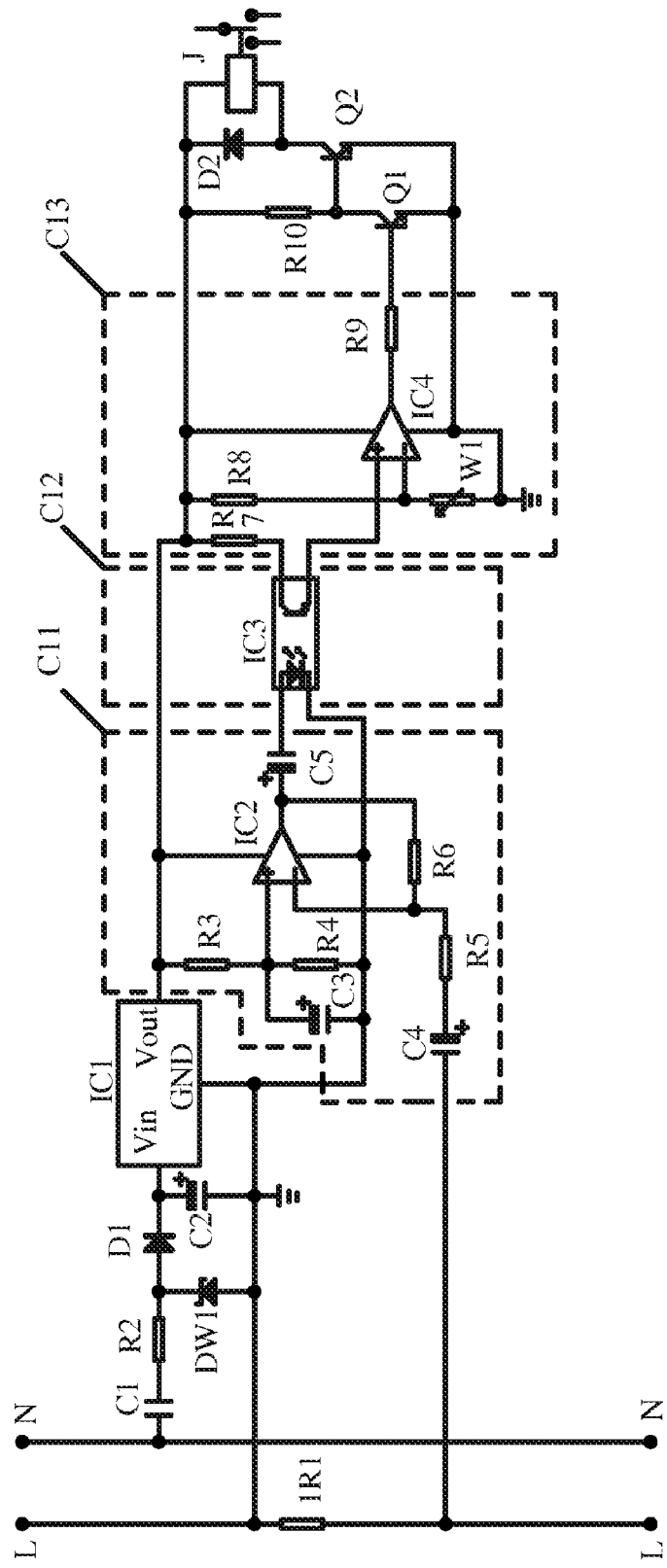
FIG. 13D is a schematic view of a current detecting module of a still further exemplary embodiment of the invention.

As shown in FIG. 13D, a manganin sheet 1R1 connected to a live wire output line L is used as a current detecting component. A voltage is generated on both ends of the manganin sheet 1R1, and is transmitted to an in-phase input end of a comparator IC4 via a signal amplifying circuit C11 and an optical coupling isolator C12. A reference voltage is set on a reversed input end of the comparator IC4. As the voltage is greater than the reference voltage, the output end of the comparator IC4 outputs a high potential signal indicating an electric device in use exceeds a rated load. At this time an instruction for switching off the power line can be transmitted to the relay J.

Figure 14:
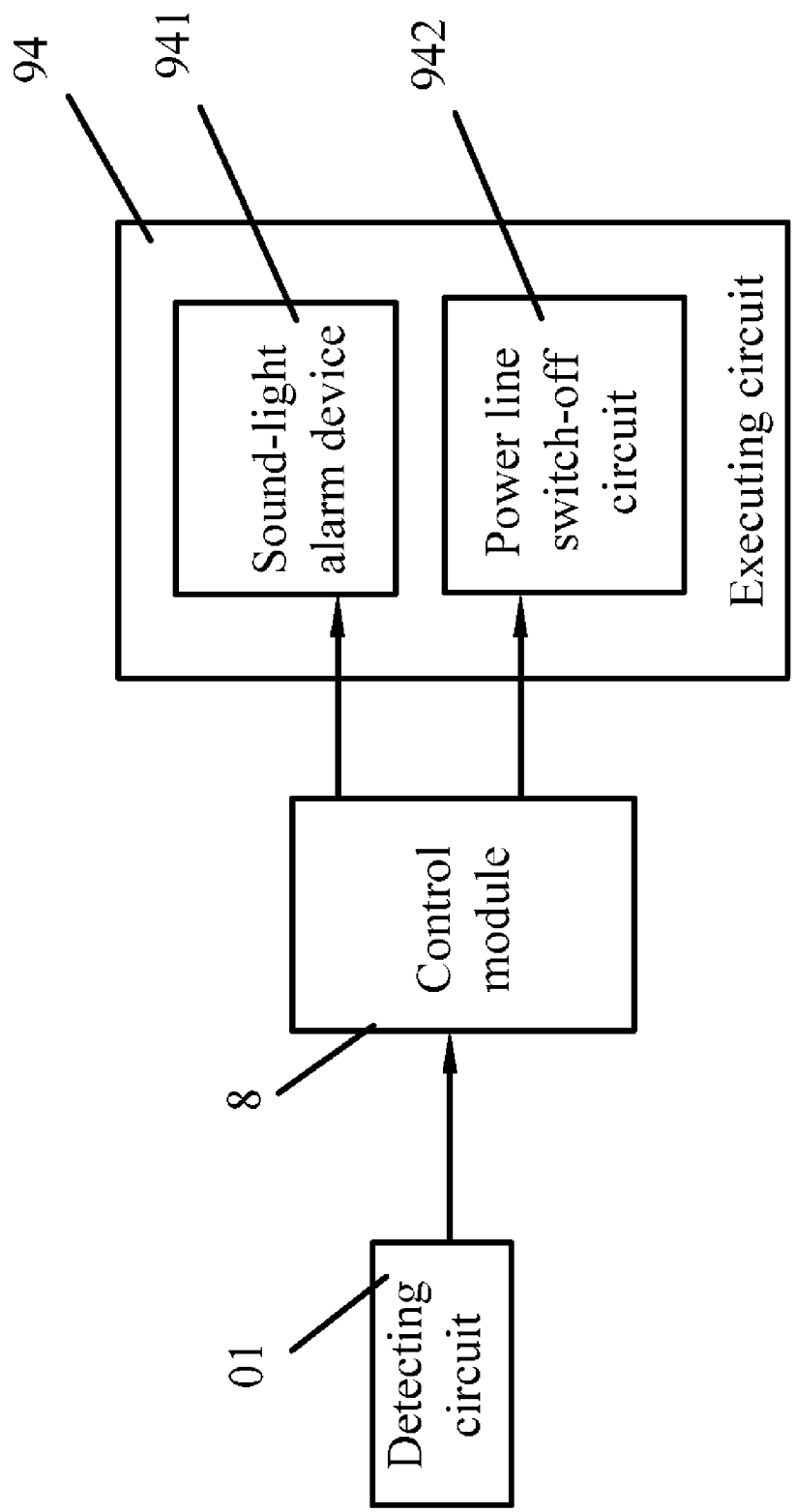
FIG. 14 is a block diagram of an anti-opening module of the invention.

As shown in FIG. 14, as the box 15 and/or the case 3 is abnormally opened, an anti-opening module generates alarm or switches off the power line, whereby preventing unwanted people from illegally stealing electricity, or nonprofessional people from opening the box 15 and/or the case 3 and being hurt by electric shock.

The anti-opening module comprises a detecting circuit 01 and an executing circuit 94.

The detecting circuit 01 operates to detect whether the box 15 and/or the case 3 are/is opened, and to transmit a control signal to a control module 8 as the box 15 and/or the case 3 are/is opened.

The executing circuit 94 receives the control signal, and generates alarm or switches off the power line connected to the box 15 and/or the case 3.

Figure 15A:
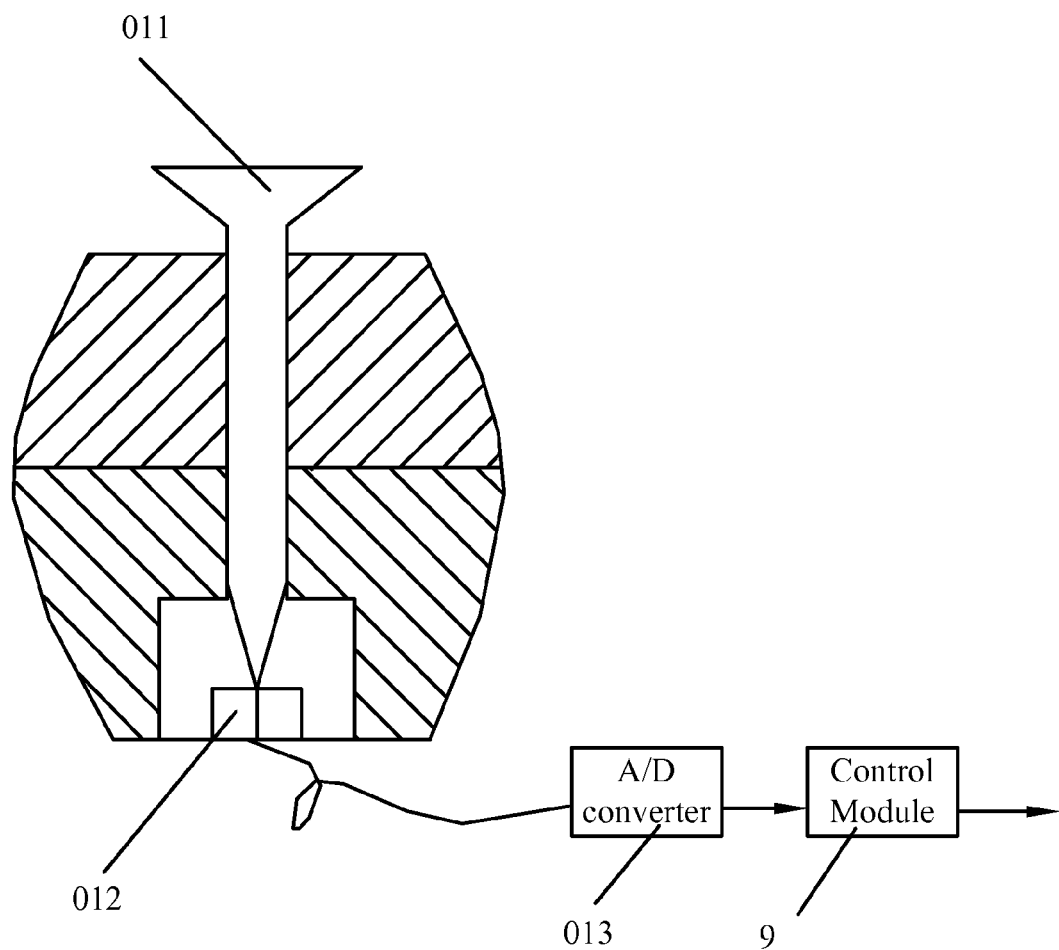
FIG. 15A is a schematic view of an opening detecting circuit of an anti-opening module of an exemplary embodiment of the invention.

As shown in FIG. 15A, a detecting circuit of an embodiment of the invention comprises a pressure sensor 012 and a screw 011.

The pressure sensor 012 is disposed at the box 152 and/or the cover 3 of the case, and connected to an A/D converter 013, and to a status signal port of the control module 8.

As the screw 011 pushes the pressure sensor 012, a detecting signal is generated and transmitted to the status signal port. If the detecting signal is less than a threshold value preset in the control module 8, a control signal is transmitted to the executing circuit 94. The executing circuit 94 can be the executing circuit 94 performing self-test as described above, and prevents the box from being abnormally opened by generating alarm and switching off the power line.

Figure 15B:
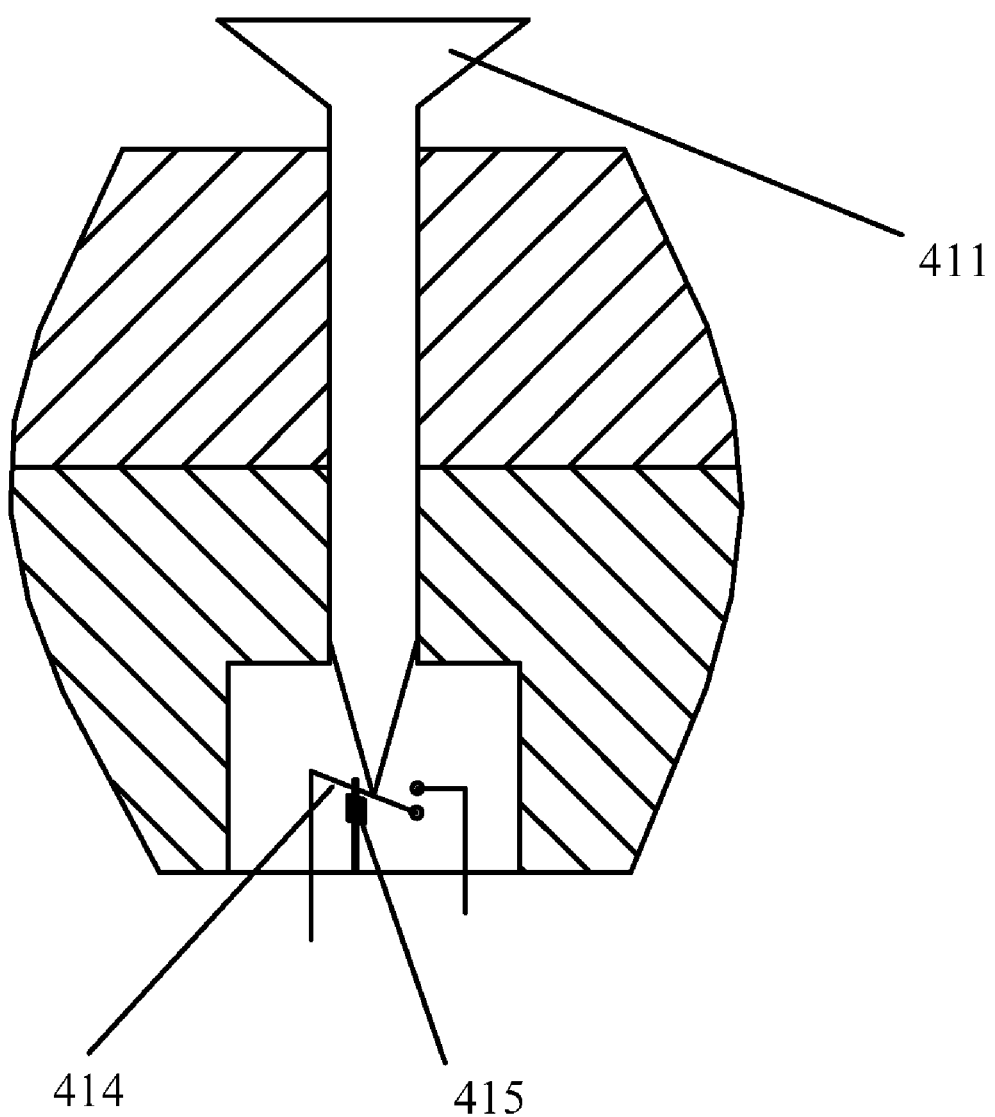
FIG. 15B is a schematic view of an opening detecting circuit of an anti-opening module of another exemplary embodiment of the invention.

As shown in FIG. 15B, a detecting circuit of another embodiment of the invention comprises a travel switch 014 or a normally closed switch (the travel switch 014 is described hereinafter as an example), a spring 015, and a screw 011.

The travel switch 014 is disposed at a packaging position of the box 152 and/or the cover 3 of the case. As there is no gap at the packaging position, the travel switch 014 outputs no signal. Otherwise, as the screw is pulled out, the travel switch is switched on under the action of the spring 015, and transmits the control signal to the executing circuit 94. The executing circuit 94 can be the executing circuit 94 performing self-test as described above, and prevents the box from being abnormally opened by generating alarm and switching off the power line.

The invention has a function of recording abnormal conditions occurred on the power line, namely recording history information in the storage circuit 422 of the counting unit 42. The storage circuit 422 is connected to the data processing circuit 421 and the detecting circuit 01. As power failure occurs, the electric energy value accumulated by the data processing circuit 421 are stored in the storage circuit 422. As power recovers, the data processing circuit 421 reads an electric energy value stored in the storage circuit 422, and records the information as the box 15 is abnormally opened.

It should be noted that to enhance functionality of the invention, an extension interface is used and connected to an extension module. The extension module is connected to the control module via a standard interface whereby facilitating plug and play.

The extension module comprises a communicating unit. The communicating unit operates to transmit abnormal conditions or electric energy values of the modular energy meter to a remote control center, or to a receiving terminal of a user, whereby facilitating exception monitoring and remote metering. The communicating unit communicates via carrier, an Ethernet, a PSTN network, a GPRS network, a GSM network, a CDMA network, or a combination thereof.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A modular energy meter, comprising
   a power line access module, comprising
      a phase line access portion having an input end and an output end; and
      a zero line access portion having an input end and an output end; and
   at least one modular energy metering device each having a phase line input end, a zero line input end, and a phase line output end;
   wherein
   said input end of said phase line access portion is connected to a phase line of a power line;
   said input end of said zero line access portion is connected to a zero line of said power line;
   said modular energy metering device operates to measure energy values output from a phase line output end and a zero line output end of said power line;
   said output end of said phase line access portion is connected to said phase line input end of said modular energy metering device;
   said phase line output end of said modular energy metering device is connected to a phase line output line;
   said output end of said zero line access portion is connected to a zero line input line; and
   the number of said zero line output lines and said phase line output lines corresponds to that of said modular energy metering devices.

2. The modular energy meter of claim 1, wherein
   said power line access module and said modular energy metering device are modularly disposed in a case; and
   said case comprises a power line input interface, a zero line output interface, a phase line output interface, and a cover.

3. The modular energy meter of claim 2, wherein
   said modular energy metering device further comprises a power supply unit, an energy metering unit, and a pulse signal output unit;
   said power supply unit operates to provides operating power;
   said energy metering unit operates to measure energy from said phase line input end and said zero line input end, and consumed by users; and
   said pulse signal output unit operates to transform energy measured by said energy metering unit into a pulse signal and to output said pulse signal.

4. The modular energy meter of claim 3, wherein
   said power supply unit, said energy metering unit, and said pulse signal output unit are disposed in a box and enclosed by a cover of said box; and
   said phase line input end and said phase line output end are disposed on both ends of said box.

5. The modular energy meter of claim 3, wherein
   said energy metering unit comprises a current signal collecting circuit, a voltage signal collecting circuit, and an operational and processing circuit;
   said current signal collecting circuit operates to collect a current signal on said power line in real time;
   said voltage signal collecting circuit operates to collect a voltage signal on said power line in real time; and
   said operational and processing circuit operates to multiply said current signal by said voltage signal whereby obtaining an instant power, and further an energy value within a given time interval by an integrator.

6. The modular energy meter of claim 3, wherein said pulse signal output unit is a voltage/frequency conversion and frequency-division circuit.

7. The modular energy meter of claim 3, wherein an output end of said pulse signal output unit and said zero line input end are integrated on a parallel port.

8. The modular energy meter of claim 1, wherein
   said phase line access portion comprises at least a phase line access sub-portion;
   said phase line access sub-portion is made of conductive materials, and comprises an input end and at least a phase line output end;
   said input end of said phase line access sub-portion is connected to said phase line of said power line; and
   said phase line output end of said phase line access sub-portion is connected to said phase line input end of said modular energy metering device.

9. The modular energy meter of claim 8, further comprising an upper shield and a lower shield made of insulation materials and heat-insulating materials, and operating to cover exposed parts of said phase line access sub-portion.

10. A modular energy meter, comprising
    a power line access module, comprising
       a phase line access portion having an input end and an output end; and
       a zero line access portion having an input end and an output end; and
    at least one modular energy metering device each having a phase line input end, a zero line input end, a phase line output end, and a zero line output end;
    wherein
    said input end of said phase line access portion is connected to a phase line of a power line;
    said input end of said zero line access portion is connected to a zero line of said power line;

said modular energy metering device operates to measure energy output from a phase line output end and a zero line output end of said power line;

said output end of said phase line access portion is connected to said phase line input end of said modular energy metering device;

said phase line output end of said modular energy metering device is connected to a phase line output line;

said output end of said zero line access portion is connected to a zero line input line; and said zero line output end of said modular energy metering device is connected to a zero line output line.

11. The modular energy meter of claim 10, wherein said power line access module and said modular energy metering device are modularly disposed in a case; and said case comprises a power line input interface, a zero line output interface, a phase line output interface, and a cover.

12. The modular energy meter of claim 11, wherein said modular energy metering device further comprises a power supply unit, an energy metering unit, and a pulse signal output unit;

said power supply unit operates to provides operating power;

said energy metering unit operates to measure energy from said phase line input end and said zero line input end, and consumed by users; and said pulse signal output unit operates to transform energy measured by said energy metering unit into a pulse signal and to output said pulse signal.

13. The modular energy meter of claim 12, wherein said power supply unit, said energy metering unit, and said pulse signal output unit are disposed in a box and enclosed by a cover of said box; and said phase line input end and said phase line output end are disposed on both ends of said box.

14. The modular energy meter of claim 12, wherein said energy metering unit comprises a current signal collecting circuit, a voltage signal collecting circuit, and an operational and processing circuit;

said current signal collecting circuit operates to collect a current signal on said power line in real time;

said voltage signal collecting circuit operates to collect a voltage signal on said power line in real time; and said operational and processing circuit operates to multiply said current signal by said voltage signal whereby obtaining an instant power, and further an energy value within a given time interval by an integrator.

15. The modular energy meter of claim 12, wherein said pulse signal output unit is a voltage/frequency conversion and frequency-division circuit.

16. The modular energy meter of claim 12, wherein an output end of said pulse signal output unit and said zero line input end are integrated on a parallel port.

17. The modular energy meter of claim 10, wherein said phase line access portion comprises at least a phase line access sub-portion;

said phase line access sub-portion is made of conductive materials, and comprises an input end and at least a phase line output end;

said input end of said phase line access sub-portion is connected to said phase line of said power line; and said phase line output end of said phase line access sub-portion is connected to said phase line input end of said modular energy metering device.

18. The modular energy meter of claim 17, further comprising an upper shield and a lower shield made of insulation materials and heat-insulating materials, and operating to cover exposed parts of said phase line access sub-portion.

* * * * *